(12) United States Patent
Kobrinsky et al.

(10) Patent No.: US 10,720,345 B1
(45) Date of Patent: Jul. 21, 2020

(54) WAFER TO WAFER BONDING WITH LOW WAFER DISTORTION

(71) Applicant: Intel Corporation, Santa Clara, CA (US)

(72) Inventors: Mauro J. Kobrinsky, Portland, OR (US); Myra McDonnell, Portland, OR (US); Brennen K. Mueller, Portland, OR (US); Chytra Pawashe, Beaverton, OR (US); Daniel Pantuso, Portland, OR (US); Paul B. Fischer, Portland, OR (US); Lance C. Hibbeler, Tillamook, OR (US); Martin Weiss, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/125,248

(22) Filed: Sep. 7, 2018

Related U.S. Application Data

(60) Provisional application No. 62/559,400, filed on Sep. 15, 2017.

(51) Int. Cl.
*H01L 21/30* (2006.01)
*H01L 21/67* (2006.01)

(52) U.S. Cl.
CPC .. *H01L 21/67092* (2013.01); *H01L 21/67103* (2013.01); *H01L 21/67109* (2013.01)

(58) Field of Classification Search
CPC ......... H01L 21/67092; H01L 21/67103; H01L 21/67109
USPC .......................................................... 438/457
See application file for complete search history.

(56) References Cited

U.S. PATENT DOCUMENTS

| | | | | |
|---|---|---|---|---|
| 8,163,570 B2 * | 4/2012 | Castex | ............. | H01L 21/76251 257/E21.53 |
| 2007/0287264 A1 * | 12/2007 | Rogers | ................ | H01L 21/187 438/457 |
| 2010/0122762 A1 * | 5/2010 | George | ................ | H01L 21/187 156/64 |
| 2011/0233546 A1 * | 9/2011 | Higashi | ................ | G01K 13/00 257/48 |
| 2012/0077329 A1 * | 3/2012 | Broekaart | ............ | H01L 21/187 438/455 |
| 2015/0122412 A1 * | 5/2015 | Phillips | ............. | H01L 21/67092 156/273.1 |
| 2017/0053823 A1 * | 2/2017 | Huang | ............. | H01L 21/67092 |

* cited by examiner

*Primary Examiner* — Long K Tran
(74) *Attorney, Agent, or Firm* — Green, Howard & Mughal LLP

(57) ABSTRACT

Techniques and mechanisms for forming a bond between two wafers. In an embodiment, a first wafer and a second wafer are positioned with respective wafer holders, and are deformed to form a first deformation of the first wafer and a second deformation of the second wafer. The first deformation and the second deformation are symmetrical with respect to a centerline which is between the first wafer and the second wafer. A portion of the first deformation is made to contact, and form a bond with, another portion of the second deformation. The bond is propagated along respective surfaces of the wafers to form a coupling therebetween. In another embodiment, one of the wafer holders comprises one of an array of elements to locally heat or cool a wafer, or an array of displacement stages to locally deform said wafer.

13 Claims, 13 Drawing Sheets

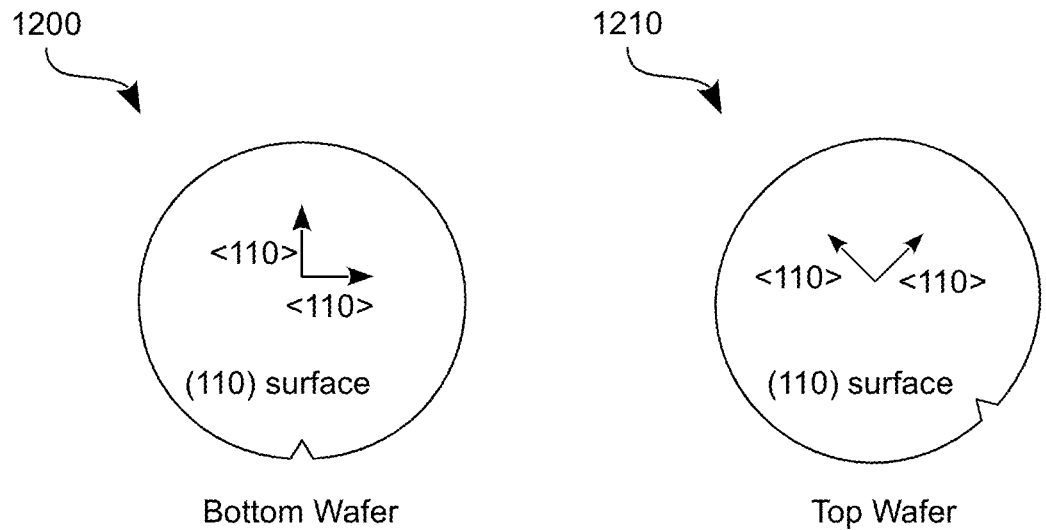
FIG. 12
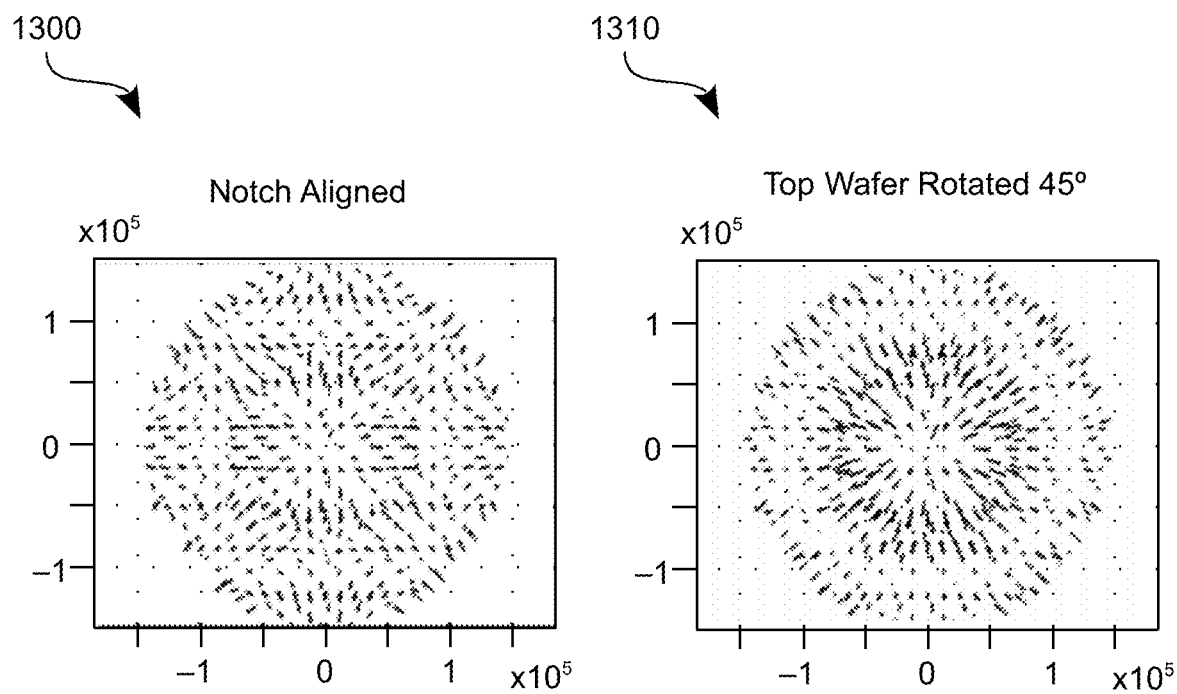
FIG. 13A
FIG. 13B

1600

Zoned Thermal Chuck + 45 rot.

1610

Radial Distortion v. Radius

1700

1800

Zoned SHape Chuck + 45 rot.

1810

Radial Distortion v. Radius

1900

WAFER TO WAFER BONDING WITH LOW WAFER DISTORTION

CROSS REFERENCE TO RELATED APPLICATIONS

This non-provisional patent application is related to, and claims priority to, the U.S. provisional application entitled "WAFER TO WAFER BONDING WITH LOW WAFER DISTORTION," filed Sep. 15, 2017, having an application Ser. No. 62/559,400, the entire contents of which are incorporated herein by reference.

BACKGROUND

1. Technical Field

Embodiments of the invention generally relate to wafer to wafer bonding, and more particularly relate to wafer to wafer bonding with low wafer distortion.

2. Background Art

In current wafer to wafer bonding, two wafers may be brought into close proximity to one another (e.g., with surfaces thereof up to 50 microns apart) and bonding may be initiated by locally deforming one of the wafers to make local contact between the wafers. The wafers then bond to one another via propagation of the local contact to full bonding of the wafers. Such techniques provide undesirable distortions in one or both of the wafers and/or undesirable stress between the wafers.

There is therefore a need to address the problem of large nonlinear and uncorrectable IPD (in-plane distortions) residuals observed during standard wafer bonding processes. These large uncorrectable IPDs can prevent subsequent patterning steps due to alignment challenges.

BRIEF DESCRIPTION OF THE DRAWINGS

The various embodiments of the present invention are illustrated by way of example, and not by way of limitation, in the figures of the accompanying drawings and in which:

FIG. 12 shows top views each of a respective wafer orientation during a wafer bond process according to an embodiment.

FIGS. 13A, 13B show plots each of an in-plane distortion during a respective wafer bond process according to a corresponding embodiment.

DETAILED DESCRIPTION

Figure 1:
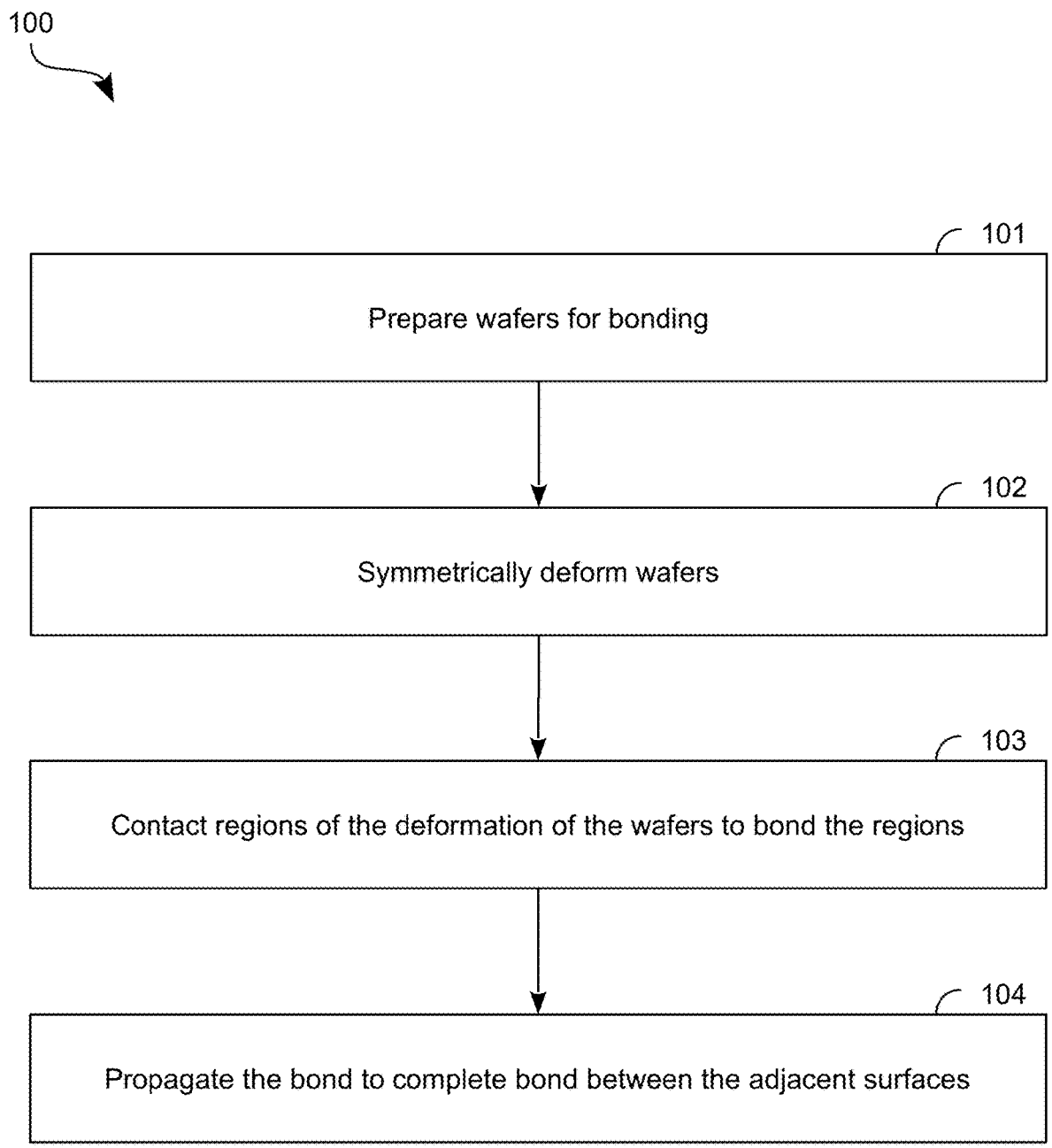
FIG. 1 illustrates a flow diagram of a process for bonding wafers using symmetrical wafer deformation according to an embodiment.

Embodiments described herein variously provide techniques and mechanisms for bonding wafers by inducing distortion to bring said wafers into contact with each other. As is described further herein, symmetric wafer to wafer bonding may include deforming a first wafer comprising a first surface and a second wafer comprising a second surface to provide a first deformed region of the first wafer (or "first deformation," for brevity) and a second deformed region of the second wafer ("second deformation") such that the first deformed region and the second deformed region are symmetrical with respect to a centerline or centered plane between the first deformed region and the second deformed region, contacting a first portion of the first surface comprising the first deformation with a second portion of the second surface comprising the second deformation to form a bond therebetween, and propagating the bond to bond the first surface of the first wafer to the second surface of the second wafer.

Such techniques may significantly minimize or virtually eliminate IPD (in plane distortion) by modifying the bonding process and hardware to deform both wafers by the substantially the same amount during bonding (e.g., symmetrically) such that when bonding is completed, both wafers can mechanically relax to an ultra-low distortion state.

One or more embodiments or implementations are now described with reference to the enclosed figures. While specific configurations and arrangements are described, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the description of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that embodiments of the present invention may be practiced without these specific details. In some instances, well-known methods and devices are shown in block diagram form, rather than in detail, to avoid obscuring embodiments of the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Wafer to wafer bonding techniques and systems for performing such techniques are described herein related to wafer to wafer bonding with low wafer distortion.

FIG. 1 illustrates a flow diagram of an exemplary process 100 for bonding wafers using symmetrical wafer deformation, arranged in accordance with at least some implementations of the present disclosure. In the illustrated implementation, process 100 may include one or more operations as illustrated by operations 101 through 104. However, embodiments herein may include additional operations, certain operations being omitted, or operations being performed out of the order provided.

Process 100 begins at operation 101, where two wafers are prepared for bonding. The preparing at operation 101 may include bringing the wafers into a state—e.g., the state including a proximity, a relative alignment, a temperature, a pressure and/or the like—in preparation for a subsequent wafer deformation. The wafers may include any suitable material or materials, substrates, device layers, metallization layers or the like. In an embodiment, one wafer is a device wafer (e.g., comprising devices formed on a surface thereof) and the other wafer is a carrier wafer. For example, one or both wafers may be or include monocrystalline silicon (Si), germanium (Ge), silicon germanium (SiGe), a III-V based material (e.g., gallium arsenide (GaAs)), a silicon carbide (SiC), a sapphire ($Al_2O_3$), or any combination thereof. In various examples, one or both wafers may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. The wafers may also be any suitable size such as 100 millimeters (mm), 150 mm, 200 mm, or 300 mm. The wafers may be prepared for bonding using any suitable technique or techniques. In an embodiment, one or both wafers are polished (e.g., the surfaces to be bonded are polished) prior to bonding. In an embodiment, the wafer surfaces to be bonded are deposited with silicon oxide layers and planarized using, for example, a chemical-mechanical polishing technique. The wafer surfaces to be bonded may include any suitable material or materials. In an embodiment, one of the wafers to be bonded is a carrier wafer comprising a glass substrate.

Process 100 continues at operation 102, where the wafers are symmetrically deformed. The wafers may be symmetrically deformed using any suitable technique or techniques such as those described further herein. As used herein the term symmetrically deformed indicates both of the wafers are deformed in the same or a similar manner with respect to a centerline or centered plane between the wafers. The centerline or centered plane may be centered between the wafers prior to deformation for example. The wafers are then contacted at respective portions or regions of the deformations to bond the portions or regions and the bond is propagated across the wafers to bond the wafers. The symmetrical deformation of the wafers decreases undesirable distortions in one or both of the wafers and/or undesirable stress between the bonded wafers.

Figure 2:
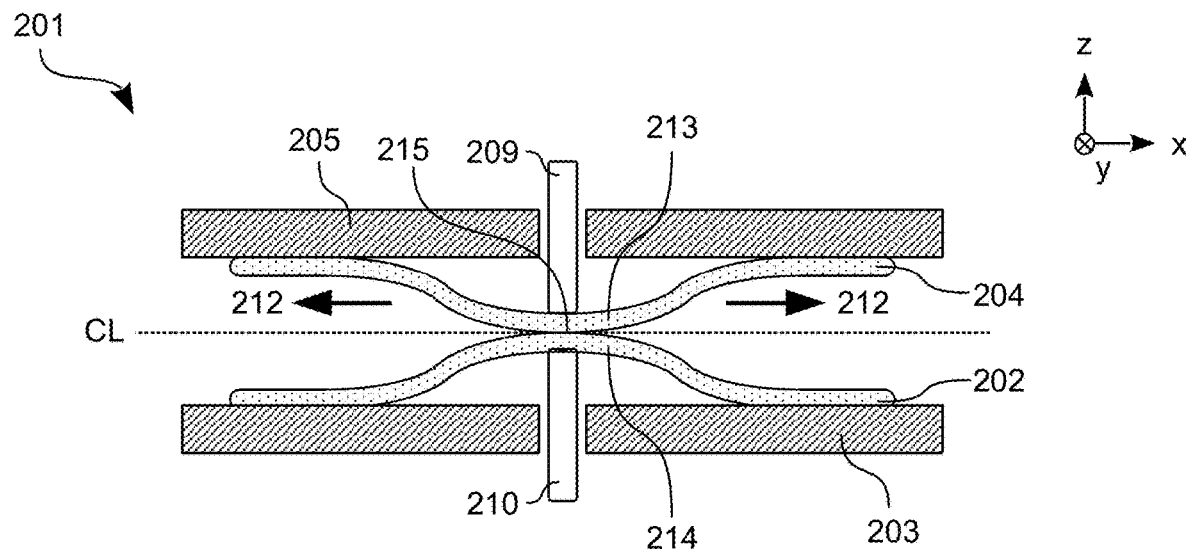
FIGS. 2 through 6 show cross-sectional side views each of a respective work piece arrangement to bond wafers according to a corresponding embodiment.

FIG. 2 illustrates a work piece arrangement 201 after the wafers are symmetrically deformed, arranged in accordance with at least some implementations of the present disclosure. The wafers may be symmetrically deformed using any suitable technique or techniques.

As shown in FIG. 2, a wafer 202 is secured to and/or handled by a wafer holder 203 and a wafer 204 is secured to and/or handled by a wafer holder 205 such that a surface of wafer 202 has been brought within close proximity of a surface of wafer 204 (e.g., before deformation). For example, the surfaces may be brought within about 10-100 microns (e.g., in the z-direction) of one another. Also as shown in FIG. 2, a wafer deformer 209 is provided such that wafer deformer 209 may protrude from wafer holder 205 to deform wafer 204 and a wafer deformer 210 is provided such that wafer deformer 210 may protrude from wafer holder 203 to deform wafer 202.

Wafer holders 203, 205 may be any suitable wafer holders such as chucks or the like. In an embodiment, wafer holders 203, 205 are vacuum chucks. In an embodiment, wafer 204 is loaded and aligned onto wafer holder 205 and wafer 204 is held in an aligned position on a face of wafer holder 205 by a vacuum applied to vacuum channels therein. Similarly, wafer 202 may be loaded and aligned onto wafer holder 203 and wafer 202 may be held in an aligned position on the face of wafer holder 203 by a vacuum applied to vacuum channels therein. In other embodiments, wafers 202, 204 are held by wafer holders 203, 205 by electrostatic force, a clamp, or the like. As shown, wafer 202 has a surface adjacent to wafer holder 203 and a surface opposite wafer holder 203. Similarly, wafer 204 has a surface adjacent to wafer holder 205 and a surface opposite wafer holder 205.

As shown with respect to work piece arrangement 201, wafer deformer 209 has deformed a portion of wafer 204 to provide a deformed region 213 of wafer 204 and wafer deformer 210 has deformed a portion of wafer 202 to provide a deformed region 214 of wafer 204 such that deformed region 213 and deformed region 214 are substantially symmetric with respect to a centerline (CL) between deformed region 213 and deformed region 214 as well as between wafer 204 and 202. In addition or in the alternative, deformed region 213 and deformed region 214 are substantially symmetric with respect to a centered plane between deformed region 213 and deformed region 214. Deformed regions 213, 214 may be characterized as deformed portions, deformations, wafer deformations, or the like. For example, deformed regions 213, 214 may be indentations, dish shaped indentations, or the like.

Returning to FIG. 1, processing continues at operation 103, where regions of the deformations of the wafers are brought into contact to bond the regions. The regions of the deformations of the wafers may be brought into contact using any suitable technique or techniques. In some embodiments, the actuation of the deformation brings the regions of the deformations into contact. In other embodiments, the deformation may be provided and the wafers (after deformation) may be moved to be brought into contact.

With returning reference to FIG. 2, as shown with respect to work piece arrangement 201, a region or portion of the surface of wafer 204 that is within or a part of deformed region 213 has contacted a region or portion of the surface of wafer 202 that is within or a part of deformed region 214 to from a bond 215 therebetween. For example, the deformations of wafers 202, 204 by wafer deformers 209, 210 causes the regions to be brought into contact in the illustrated embodiment. In another embodiment, wafers 202, 204 may be fully deformed by wafer deformers 209, 210 and, subsequently, the regions may be brought into contact by moving one or both of the wafers.

Returning to FIG. 1, processing continues at operation 104, where the bond initiated between regions of the wafers is propagated to complete the bond between the adjacent surfaces of wafers 202, 204. Since the surfaces were brought into contact at bond 215 as described (e.g., via a "point" contact), the initiated bond may propagate outwardly (e.g., in the x-y directions) as shown with respect to arrows 212 from the centers of wafers 202, 204 to complete the bond therebetween. For example, after initial contact, the wafers may bond together based on attractive forces therebetween.

In the illustrated embodiment, wafer deformers 209, 210 are pins or the like that protrude from wafer handlers 205, 203, respectively. Wafer deformers 209, 210 may be considered as portions of (e.g., integral to) wafer handlers 205, 203 or they may be separate from wafer handlers 205, 203. Wafer deformers 209, 210 may be any suitable deformers such as pins, pegs, piezoelectric actuators, wedges, or the like. In an embodiment, deforming wafers 202, 204 includes pushing pins (e.g., as implemented as wafer deformers 209, 210) into the back surfaces of wafers 202, 204 (e.g., the surfaces adjacent to wafer handlers 203, 205).

Furthermore, in the embodiment illustrated in FIG. 2, wafer deformers 209, 210 provide deformed regions 213, 214 at locations substantially at a center of wafers 202, 204 by providing a force on each of the back surfaces of wafers 202, 204 that are orthogonal to the back (and front surfaces) of wafers 202, 204. Such orthogonal forces may provide orthogonal deformations of deformed regions 213, 214. In an embodiment, wafer deformers 209, 210 provide deformed regions 213, 214 orthogonal to their respective front surfaces (e.g., surfaces opposite wafer handlers 203, 205) of wafers 202, 204 and a location within a particular threshold distance from a center of wafers 202, 204. For example, the location may be within 3 mm of a center of wafers 202, 204, within 1 mm of a center of wafers 202, 204, or the like.

As described with respect to FIGS. 1 and 2, bonding wafers may include deforming wafer 202, which has a surface opposite wafer hander 203, and wafer 204, which has a surface opposite wafer hander 205, to provide deformed region 214 of wafer 202 and deformed region 213 of wafer 204 such that deformed region 214 and deformed region 213 are symmetrical with respect to a centerline (CL) therebetween. Portions of deformed regions 213, 214 are contacted to form a bond therebetween and the bond is propagated to bond the adjacent surfaces of wafers 202, 204. In the embodiments illustrated by FIG. 2, such processing may include deforming regions at or near the center of wafers 202, 204 using wafer deformers 209, 210 and propagating the bond outwardly. However, such techniques may be used to symmetrically deform regions of wafers 202, 204, bring those regions into contact to form a bond, and propagate the bond using any suitable symmetrical deformation, contacting of deformed regions, or bond propagation such as those illustrated and described herein with respect to FIGS. 3, 4, 5, and 6.

Figure 3:
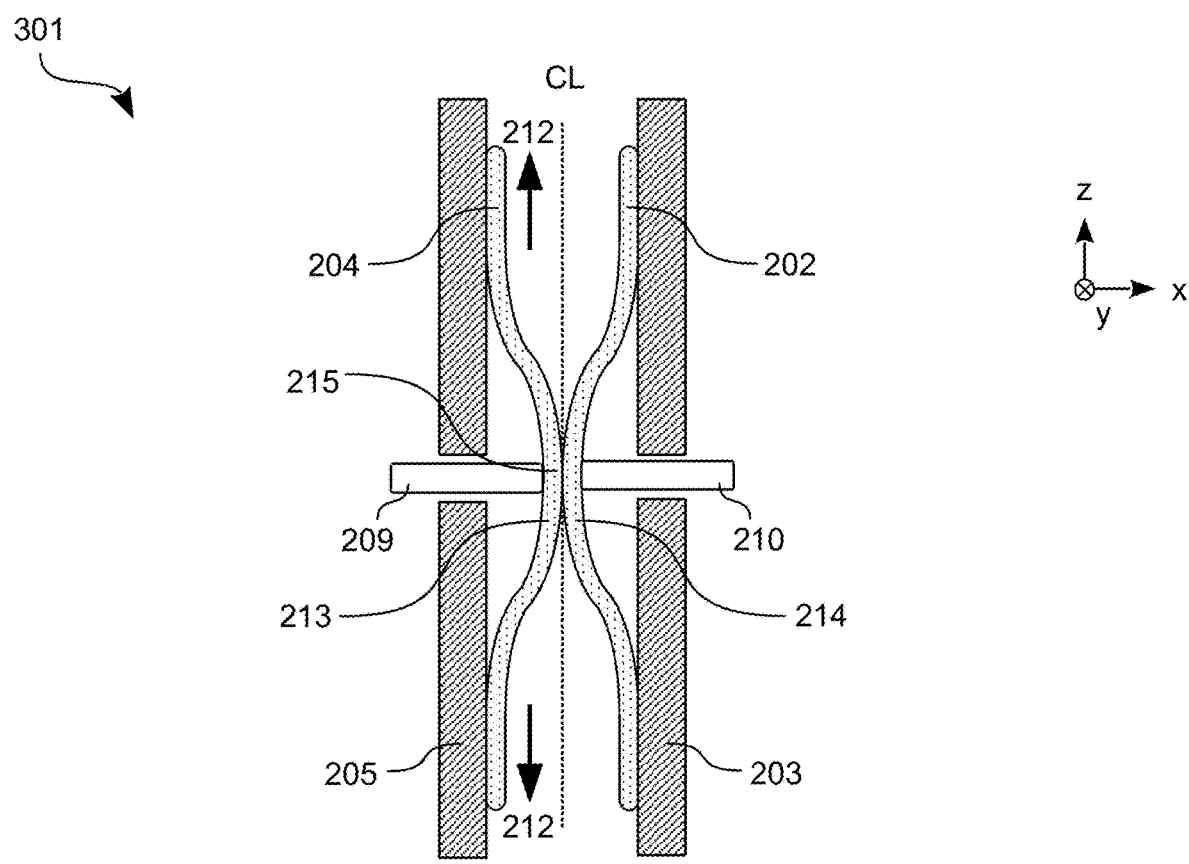

FIG. 3 illustrates a work piece arrangement 301 after the wafers are symmetrically deformed using a vertical work piece arrangement, arranged in accordance with at least some implementations of the present disclosure. The wafers may be symmetrically deformed using any suitable technique or techniques.

As shown in FIG. 3, wafer 202 is secured to and/or handled by a wafer holder 203 comprising a wafer deformer 209 and wafer 204 is secured to and/or handled by a wafer holder 205 comprising a wafer deformer 210 such that a surface of wafer 202 has been brought within close proximity of a surface of wafer 204 as described herein. As shown, wafer 202 has a surface adjacent to wafer holder 203 and a surface opposite wafer holder 203 and wafer 204 has a surface adjacent to wafer holder 205 and a surface opposite wafer holder 205 such that the surfaces are oriented vertically with respect to such that the surfaces are substantially aligned with local gravity (e.g., the surfaces are perpendicular to the surface of earth). Such vertical orientation of work piece arrangement 301 during deformation and bonding may advantageously reduce the effects of gravity during horizontal bonding.

As shown with respect to work piece arrangement 301, wafer deformer 209 has deformed a portion of wafer 204 to provide deformed region 213 of wafer 204 and wafer deformer 210 has deformed a portion of wafer 202 to provide a deformed region 214 of wafer 204 such that deformed region 213 and deformed region 214 are substantially symmetric with respect to a vertical centerline (CL) between deformed region 213 and deformed region 214 as well as between wafer 204 and 202. In addition or in the alternative, deformed region 213 and deformed region 214 are substantially symmetric with respect to a centered plane between deformed region 213 and deformed region 214.

As described with respect to FIG. 1, regions of the deformations of the wafers are brought into contact to bond the regions. The regions of the deformations of the wafers may be brought into contact using any suitable technique or techniques as described herein. As shown with respect to work piece arrangement 301, a region or portion of the surface of wafer 204 that is within or a part of deformed region 213 has contacted a region or portion of the surface of wafer 202 that is within or a part of deformed region 214 to from a bond 215 therebetween. For example, the deformations of wafers 202, 204 by wafer deformers 209, 210 causes the regions to be brought into contact in the illustrated embodiment. In another embodiment, wafers 202, 204 may be fully deformed by wafer deformers 209, 210 and, subsequently, the regions may be brought into contact by moving one or both of the wafers.

The bond initiated between the regions of the wafers is propagated to complete the bond between the adjacent surfaces of wafers 202, 204. Since the surfaces were brought into contact at bond 215 as described (e.g., via a "point" contact), the initiated bond may propagate outwardly (e.g., in the x-y directions) as shown with respect to arrows 212 from the centers of wafers 202, 204 to complete the bond therebetween. For example after initial contact, the wafers may bond together based on attractive forces therebetween.

In the embodiment illustrated in FIG. 3, as in the embodiment of FIG. 2, wafer deformers 209, 210 provide deformed regions 213, 214 at locations substantially at a center of wafers 202, 204 by providing a force on each of the back surfaces of wafers 202, 204 that are orthogonal to the back (and front surfaces) of wafers 202, 204. Such orthogonal forces may provide orthogonal deformations of deformed regions 213, 214. In an embodiment, wafer deformers 209, 210 provide deformed regions 213, 214 orthogonal to their respective front surfaces (e.g., surfaces opposite wafer handlers 203, 205) of wafers 202, 204 and a location within a particular threshold distance from a center of wafers 202, 204. For example, the location may be within 3 mm of a center of wafers 202, 204, within 1 mm of a center of wafers 202, 204, or the like. Furthermore, the vertical orientation described with respect to FIG. 3 may be used in combination with any other work piece arrangements such as those illustrated and described herein with respect to FIGS. 4, 5, and 6.

Figure 4:
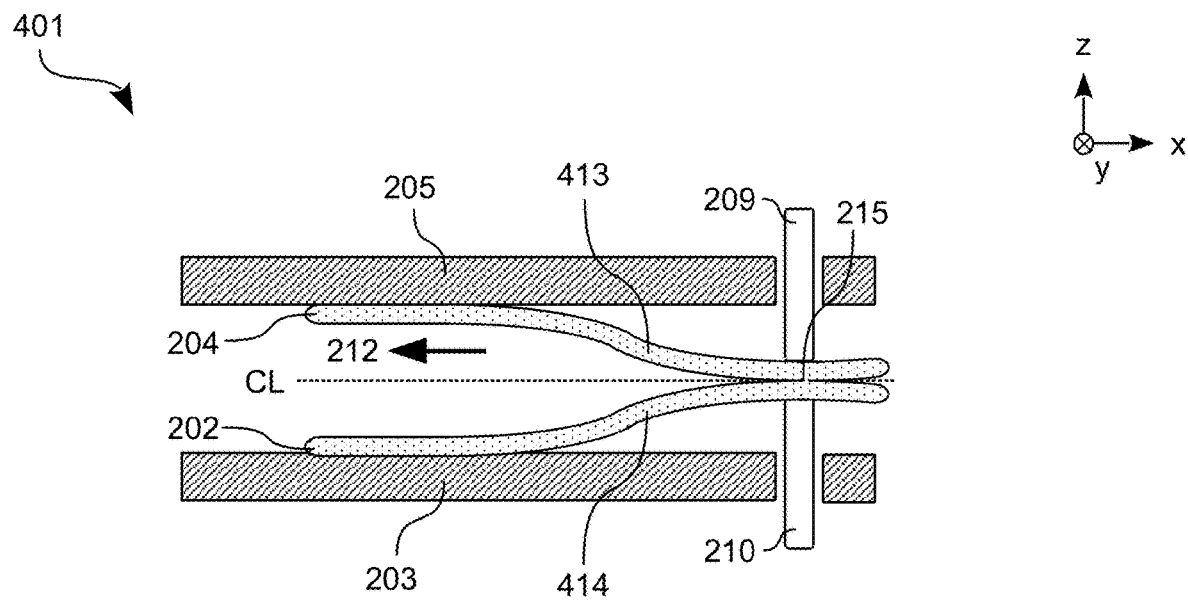

FIG. 4 illustrates a work piece arrangement 401 after the wafers are symmetrically deformed at or near edges of the wafers, arranged in accordance with at least some implementations of the present disclosure. The wafers may be symmetrically deformed using any suitable technique or techniques.

As shown in FIG. 4, wafer 202 is secured to and/or handled by a wafer holder 203 comprising a wafer deformer 209 and wafer 204 is secured to and/or handled by a wafer holder 205 comprising a wafer deformer 210 such that a surface of wafer 202 has been brought within close proximity of a surface of wafer 204 as described herein. As shown with respect to work piece arrangement 401, wafer deformer 209 has deformed a portion of wafer 204 to provide deformed region 413 of wafer 204 and wafer deformer 210 has deformed a portion of wafer 202 to provide a deformed region 414 of wafer 204 such that deformed region 413 and deformed region 414 are substantially symmetric with respect to a vertical centerline (CL) between deformed region 413 and deformed region 414 as well as between wafer 204 and 202. In addition or in the alternative, deformed region 413 and deformed region 414 are substantially symmetric with respect to a centered plane between deformed region 413 and deformed region 414.

Furthermore, deformed region 413 and deformed region 414 are formed at or near an edge of wafers 202, 204 such that the strike or deformation or the like to initiate a bond between wafers 202, 204 is formed at or near an edge thereof. In the illustrated embodiment, a single strike point is used between wafers 202, 204. However, any number of strike points may be used such as two (e.g., at opposite edges of wafers 202, 204), four (such that pairs are at opposite edges of wafers to provide strike points at 90° angles with respect to a center of wafers 202, 204), or the like.

As shown in FIG. 4, wafer deformers 209, 210 provide deformed regions 413, 414 at locations within edge regions of wafers 202, 204 by providing a force on each of the back surfaces of wafers 202, 204 that are orthogonal to the back (and front surfaces) of wafers 202, 204. Such orthogonal forces may provide orthogonal deformations of deformed regions 413, 414. In an embodiment, wafer deformers 209, 210 provide deformed regions 413, 414 orthogonal to their respective front surfaces (e.g., surfaces opposite wafer handlers 203, 205) of wafers 202, 204 and a location within a particular threshold distance from an edge of wafers 202, 204. For example, the location may be within 20 mm of a center of wafers 202, 204, within 10 mm of a center of wafers 202, 204, within 5 mm of a center of wafers 202, 204, or the like. In the illustrated embodiment, work piece orientation 401 provides a horizontal orientation of wafers 202, 204. In an embodiment, the vertical orientation described with respect to FIG. 3 may be used in combination with the edge deformation techniques described with respect to FIG. 4. Such a vertical orientation, wherein deformation is initiated closer to a wafer edge, causes bond propagation to move in a direction with gravity or against gravity, which may be beneficial to IPD.

As described herein, the bond initiated between the regions of the wafers is propagated to complete the bond between the adjacent surfaces of wafers 202, 204. Since the surfaces were brought into contact at bond 215 as described (e.g., via a "point" contact), the initiated bond or bonds may propagate outwardly (e.g., in the x-y directions) as shown with respect to arrows 212 from the centers of wafers 202, 204 to complete the bond therebetween as described herein.

Figure 5:
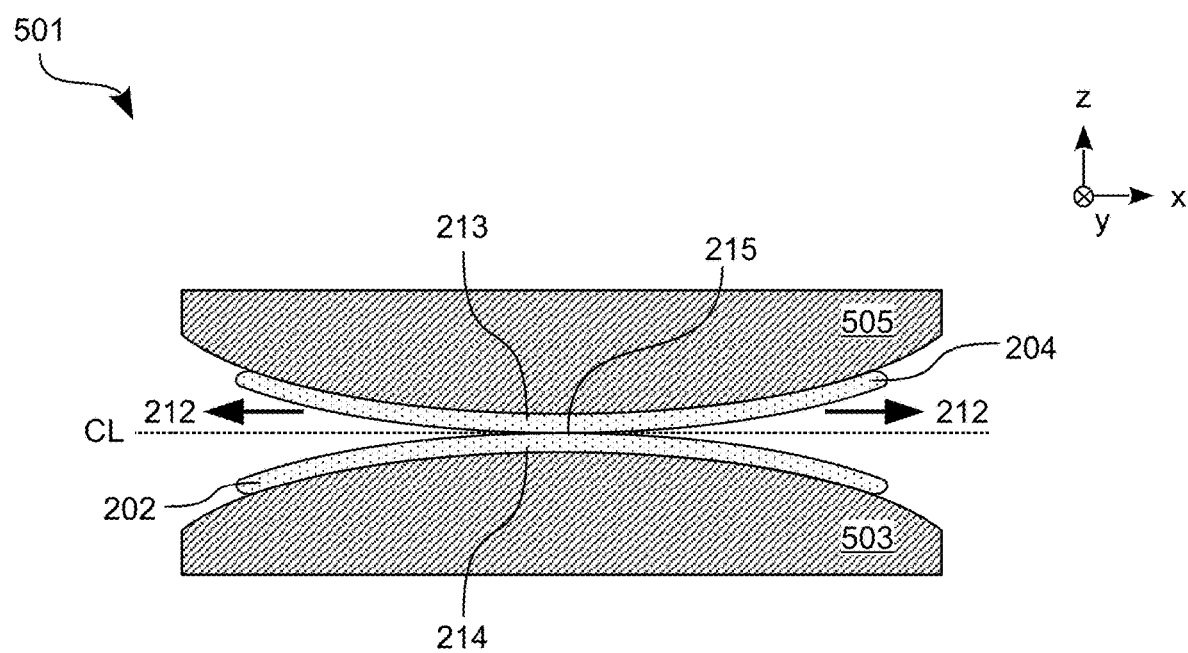

FIG. 5 illustrates a work piece arrangement 501 after the wafers are symmetrically deformed using conformal chuck bonding, arranged in accordance with at least some implementations of the present disclosure.

As described herein, a pin or peg or the like may be used as a wafer deformer to deform wafers 202, 204. In other embodiments, a pre-shaped chuck may be used to provide the symmetrical deformation such that the wafer holders or chucks used to secure the wafers have symmetrical shapes with respect to a centerline or centered plane therebetween.

As shown in FIG. 5, wafer 202 is secured to and/or handled by a wafer holder 503 having a predefined shape that deforms at least a portion of wafer 202 and wafer 204 is secured to and/or handled by a wafer holder 505 having a predefined shape that deforms at least a portion of wafer 204 symmetrically with respect to the deformation of wafer 202. In the illustrated embodiment, wafer holders 503, 505 have substantially curved surfaces such that a center point of wafer holders 503, 505 is offset with respect to edges of wafer holders 503, 505 and a curved cross-sectional shape is provided therebetween. However, wafer holders 503, 505 may have any suitable shapes that provide substantially symmetric deformations 213, 214 with respect to centerline (CL) and/or a centered plane therebetween. For example, wafer holders 503, 505 may have centered nubs or protruding regions to provide symmetric deformations 213, 214 similar to those illustrated in FIGS. 1 and 2, nubs or protruding regions within an edge region of wafers 202, 204 to provide symmetric deformations 213, 214 similar to those illustrated in FIG. 4. In some embodiments, wafer holders 503, 505 may have more complex 3D shape such as those described herein with respect to providing a shape-controlled chuck. For example, any shape described herein with respect to shape-controlled chucks or wafer handlers may be fabricated into wafer holders 503, 505 such that wafer holder 503 having a predefined shape that deforms at least a portion of wafer 204 symmetrically with respect to the deformation of wafer 202.

As shown in FIG. 5 with respect to work piece arrangement 501, a region or portion of the surface of wafer 204 that is within or a part of deformed region 213 is brought into contact with a region or portion of the surface of wafer 202 that is within or a part of deformed region 214 to from a bond 215 therebetween. For example, the deformations of wafers 202, 204 implemented or caused by wafer holders 503, 505 are brought into contact. The regions may be brought into contact to form bond 215 using any suitable technique or techniques. In an embodiment, wafers 202, 204 are brought into contact by moving one or both of wafers 202, 204 by moving one or both of wafer holders 503, 505.

As described herein, the bond initiated between the regions of the wafers is propagated to complete the bond between the adjacent surfaces of wafers 202, 204. Since the surfaces were brought into contact at bond 215 as described (e.g., via a "point" contact), the initiated bond or bonds may propagate outwardly (e.g., in the x-y directions) as shown with respect to arrows 212 from the centers of wafers 202, 204 to complete the bond therebetween as described herein.

Figure 6:
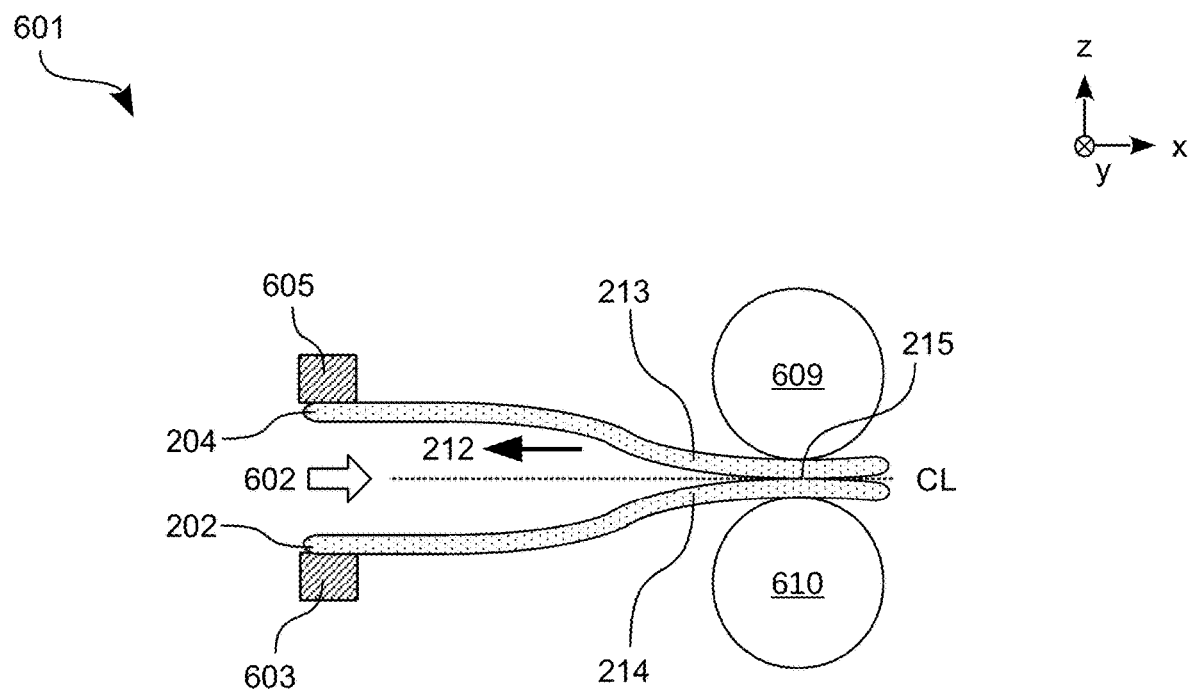

FIG. 6 illustrates a work piece arrangement 601 after the wafers are symmetrically deformed using roller bonding, arranged in accordance with at least some implementations of the present disclosure.

As described herein, a pin or peg or the like may be used as a wafer deformer to deform wafers 202, 204. In other embodiments, a roller or the like may be used to provide the symmetrical deformation such that the wafers are fed between rollers or such that rollers are moved across the wafers to provide the deformation and initiate the bond. Optionally, the wafers may be continually fed between the rollers or the rollers may be continually moved across the wafers to aid in the propagation of the bond between the wafers. As shown in FIG. 6, wafer 202 is secured to and/or handled by a wafer holder 603 and wafer 204 is secured to and/or handled by a wafer holder 605. Wafer holders 603, 605 may be any suitable wafer holders or chucks or the like as described herein and wafers 202, 204 may be secured to wafer holders 603, 605 using any suitable technique or techniques. As shown, wafers 202, 204 are moved between rollers 609, 610 via movement of wafer holders 603, 605 (as shown by feed direction 602) and/or rollers 609, 610 are moved with respect to wafers 202, 204 such that wafers 202, 204 are pinched between rollers 609, 610 to provide substantially symmetric deformations 213, 214 with respect to centerline (CL) and/or a centered plane therebetween.

As shown with respect to work piece arrangement 601, roller 609 has deformed a portion of wafer 204 to provide deformed region 213 of wafer 204 and roller 610 has deformed a portion of wafer 202 to provide a deformed region 214 of wafer 204 such that deformed region 213 and deformed region 214 are substantially symmetric with respect to a centerline (CL) between deformed region 213 and deformed region 214 as well as between wafer 204 and 202. In addition or in the alternative, deformed region 213 and deformed region 214 are substantially symmetric with respect to a centered plane between deformed region 213 and deformed region 214.

Also as shown, a region or portion of the surface of wafer 204 that is within or a part of deformed region 213 has contacted a region or portion of the surface of wafer 202 that is within or a part of deformed region 214 to from bond 215 therebetween. For example, the deformations of wafers 202, 204 by wafer deformers 209, 210 causes the regions to be brought into contact. As described herein, the bond initiated between regions of the wafers is propagated to complete the bond between the adjacent surfaces of wafers 202, 204. The initiated bond may propagate across wafers 202, 204 as shown with respect to arrow 212 from the edge of wafers 202, 204 to complete the bond therebetween. In an embodiment, the motion of wafers 202, 204 and/or rollers 609, 610 may continue along with a bond front of deformed regions 213, 214 to aid in the formation of a bond between wafers 202, 204. Rollers 609, 610 may be any suitable size and any suitable material that provides for deformed regions 213, 214. In an embodiment, rollers 609, 610 have a width (e.g., in the y-direction) that is no less than a diameter of wafers 202, 204. In an embodiment, rollers 609, 610 have a diameter in the range of 10 mm to 100 mm.

As described herein, during wafer to wafer bonding, one wafer holder (or chuck) induces distortions in that wafer. Such distortions are controllable and can be made to compensate for bonding distortions. The end result, after wafer to wafer bonding, provides a reduced, linearized, correctable (e.g., by patterning tools and processes) final distortion field. As described herein, in some embodiments, one wafer holder (or chuck) induces distortions in that wafer while the other wafer holder (or chuck) does not. In other embodiments, both wafer holders (or chucks) may induce distortions in their respective wafers.

In an embodiment, a specialized wafer holder or chuck includes an array of heating and cooling elements that induce thermal expansion or contraction in the wafer. In an embodiment, a specialized wafer holder or chuck includes an array of displacement stages, which can create a controllable non-flat shape in the wafer. Both such approaches create controllable distortions in the wafer to reduce final distortion after wafer to wafer bonding. In addition or in the alternative, an orientation of one wafer may be offset by 45 degrees with respect to the other wafer. For examples where both wafers are or include (100) silicon, such an offset of alignment suppresses rotational components of bonding distortion and reduces correcting the distortion problem from two components (e.g., radial and azimuthal distortions) to one component (e.g., radial distortion). In some embodiments, such techniques reduce the required complexity of the specialized chuck (e.g., comprising an array of heating and cooling elements and/or an array of displacement stages) described herein. Using the described techniques, the IPD residuals may be reduced by about 4×, which may enable subsequent patterning steps.

Figure 7:
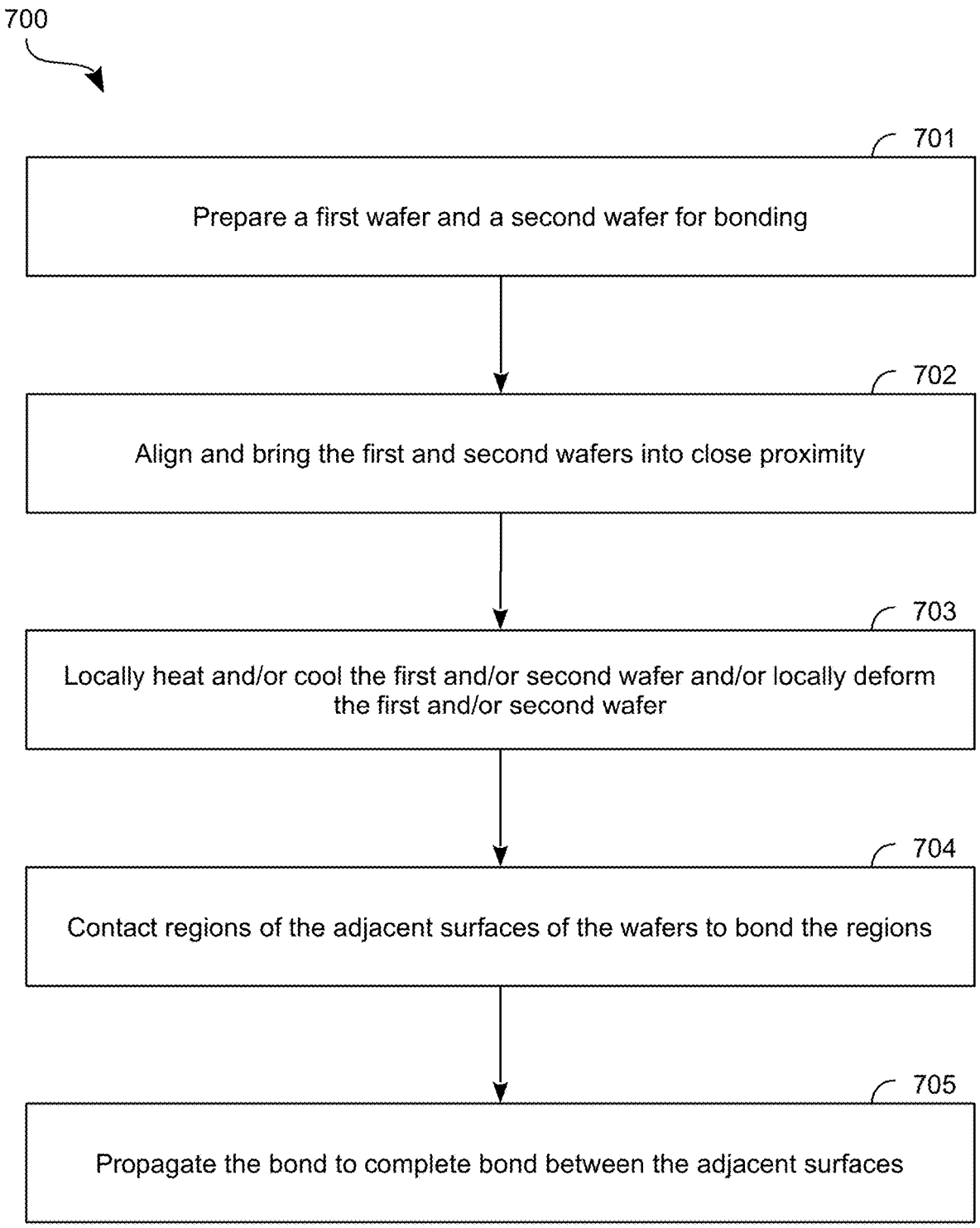
FIG. 7 illustrates a flow diagram of a process for bonding wafers according to an embodiment.

FIG. 7 illustrates a flow diagram of an exemplary process 700 for bonding wafers using a specialized chuck, arranged in accordance with at least some implementations of the present disclosure. In the illustrated implementation, process 700 may include one or more operations as illustrated by operations 701-705. However, embodiments herein may include additional operations, certain operations being omitted, or operations being performed out of the order provided.

Process 700 begins at operation 701, where wafers are prepared for bonding as described with respect to operation 101 herein. Processing continues at operation 702, where the wafers are aligned and their surfaces are brought within close proximity. For example, wafers 202, 204 wafers may be secured to and/or handled by wafer holders such that one or both are specialized to provide local thermal control or local displacement as described further herein. Processing continues at operation 703, where local thermal control (e.g., heating or cooling) and/or local displacement (e.g., deformation) are applied to one or both of the wafers as described further herein. Processing continues at operation 704, where regions of the wafers are contacted to bond the regions. For example, bonding small regions of the wafers (e.g., at a center of the wafers) may begin a bonding that will propagate a bond between the wafers radially out from the initially contacted center regions. Such bonding initiation may be provided by a pin or peg local deformer or the like as described herein. Processing continues at operation 705, where the bond initiated between regions of the wafers is propagated to complete the bond between the adjacent wafer surfaces. For example after initial contact, the wafers may bond together under the attraction therebetween. Operations of process 700 may be achieved using any suitable structures, techniques, or the like as further described herein.

Figure 8:
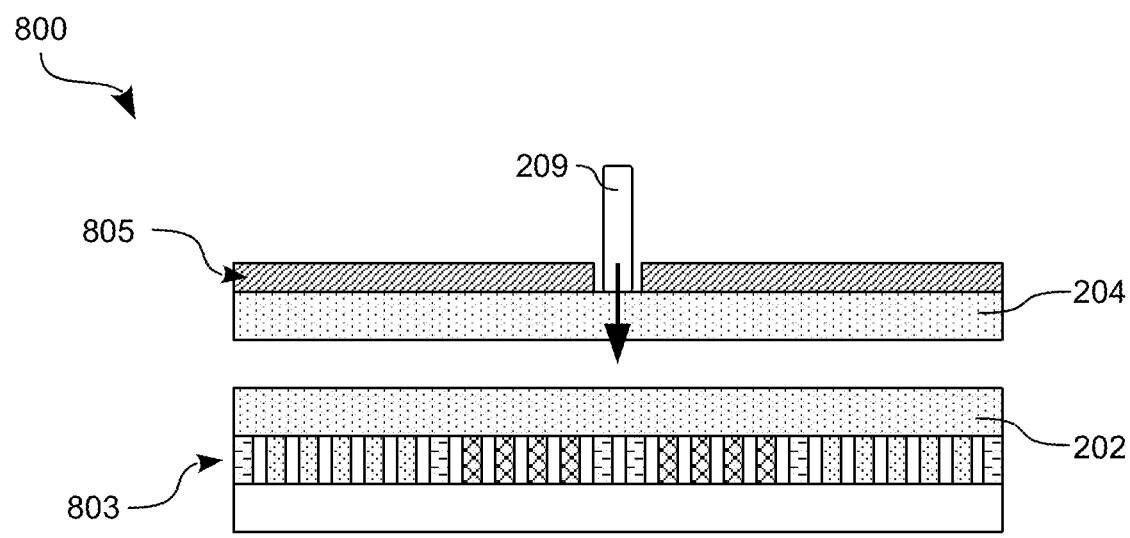
FIG. 8 shows a cross-sectional side view of a work piece arrangement to bond wafers according to an embodiment.
Figure 9A:
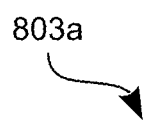
FIGS. 9A, 9B show top-views each of a respective wafer holder to facilitate wafer bonding according to a corresponding embodiment.
Figure 9A:
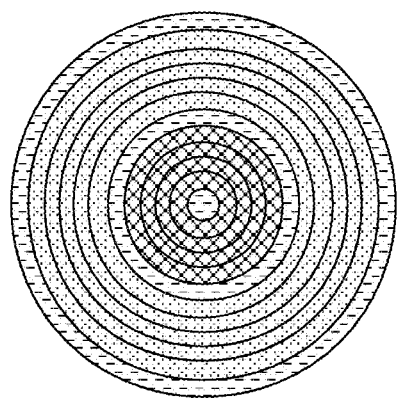
Figure 9B:
Figure 9B:
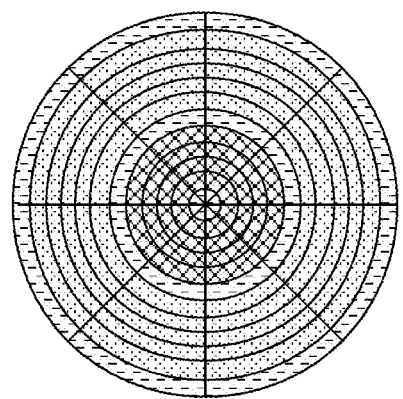

FIGS. 8, 9A and 9B illustrate a wafer bonding system comprising a zoned thermal chuck according to an embodiment. FIG. 8 illustrates a cross-sectional side-view 800 of a wafer bonding system with a zoned thermal chuck for the bottom wafer, arranged in accordance with at least some implementations of the present disclosure. For example, different regions or zones of the bottom wafer may be held at different temperatures prior to bonding. The bonding sequence begins when wafer deformer 209 (e.g., an initiation pin) pushes the top wafer into contact with the bottom wafer, and the top chuck releases the top wafer. FIGS. 9A, 9B illustrate top down views 803a, 803b of example thermal chucks: FIG. 9A illustrates a 12-zone thermal chuck with radial control zones and FIG. 9B illustrates a 96-zone thermal chuck with radial and azimuthal control zones. In the example embodiment show, interior regions are at a higher temperature, and the peripheral regions are at a lower temperature.

As shown, in some embodiments, a bottom chuck or wafer holder 803 includes any number (e.g., twelve in the illustrated embodiment) independent temperature zones as provided by local heating and/or cooling elements, which provide local heating or cooling of bottom wafer 202. As shown in the embodiment illustrated with respect to FIG. 9A, each zone may capture a different radius of the wafer. In some embodiments, the zones are further refined and also capture different azimuthal sections of the wafer independently as shown in FIG. 9B. The local cooling and heating of the wafer induces thermal expansion or contraction in wafer 202, which can be tuned to compensate for the distortion due to bonding.

The local heating and/or cooling elements may include any suitable elements that provide local heating and or cooling. In some embodiments, local heating and/or cooling elements include one or more of resistive heaters, thermoelectric heaters, thermoelectric coolers, liquid or gas flow through a fluid channel where the fluid temperature is controlled externally (e.g., a channel to flow a temperature-controlled liquid or gas). As described herein, the required power for such temperature elements is on the order of tens of Watts and temperature changes are a few degrees C., which may be readily provided using such heating and cooling elements. The chucking system of wafer holder 803 for securing wafer 202 may be: vacuum, electrostatic, or adhesive.

For example, wafer holder 803, via temperature changes in wafer 202 may provide resolution of thermal control for the bottom chuck (e.g., wafer holder 803) to compensate for complex bonding distortion profiles during wafer to wafer bonding.

In the embodiment illustrated in FIG. 8, the bottom chuck (e.g., wafer holder 803) has local heating and/or cooling elements. In an embodiment, the top chuck (e.g., wafer holder 805) has local heating and/or cooling elements. In an embodiment, both the bottom chuck (e.g., wafer holder 803) and the top chuck (e.g., wafer holder 805) have local heating and/or cooling elements.

In an embodiment, a system for wafer to wafer bonding includes wafer holder 805 to hold wafer 204 comprising a surface opposite wafer holder 805, a wafer holder 803 to hold wafer 202 comprising a surface opposite wafer holder 803 such that wafer holder 803 includes an array of local heating and/or cooling elements to locally heat and/or cool wafer 202 to induce thermal expansion and/or contraction in wafer 202, and wafer deformer 209 to bring a region of the surface opposite wafer holder 805 into contact with a region of the surface opposite wafer holder 803. As shown in FIG. 9A, in an embodiment, the array of local heating and/or cooling elements comprise an array of concentric annular heating and/or cooling elements. As shown in FIG. 9B, in an embodiment, the array of local heating and/or cooling elements comprises an array of concentric arc shaped heating and/or cooling elements. As shown in FIG. 9B, in an embodiment, the array of local heating and/or cooling elements comprises an array of concentric arc shaped heating and/or cooling elements such that each concentric arc shaped heating and/or cooling element is a portion or piece of an annular collection of arc shaped heating and/or cooling elements. As described herein, the local heating and/or cooling elements may be any suitable heating and/or cooling elements such as resistive heating element, a thermoelectric heater, a thermoelectric cooler, or a channel to flow a temperature-controlled liquid or gas. Furthermore, heating and/or cooling elements may have any suitable shape in addition to or in alternative to the illustrated arc and ring shapes such as a grid of square, rectangular, pin shaped, circular or round heating and/or cooling elements, an array of linear heating and/or cooling elements, or concentric oval shaped heating and/or cooling elements.

Figure 10:
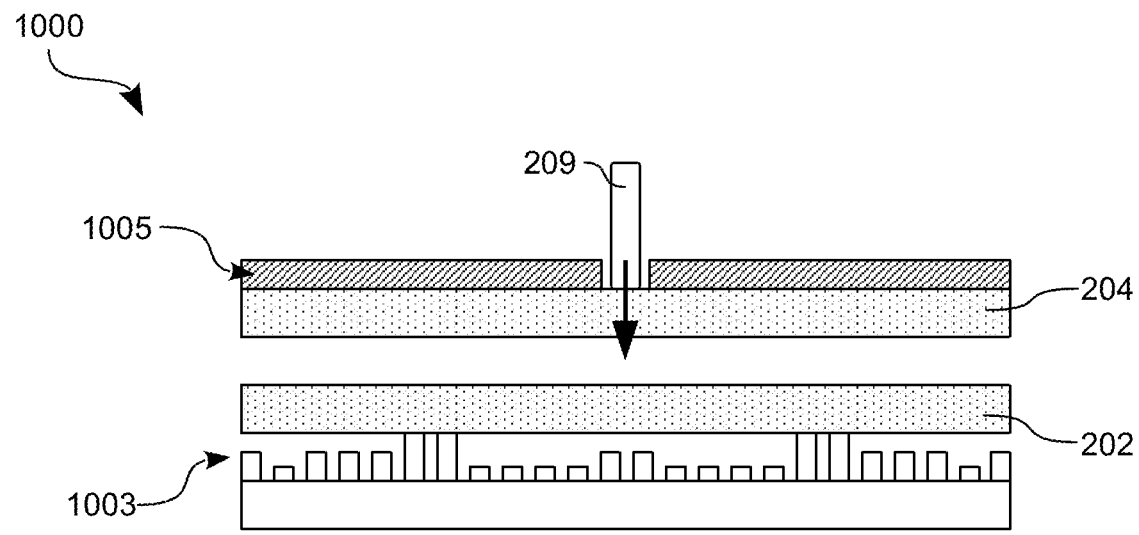
FIG. 10 shows a cross-sectional side view of a work piece arrangement to bond wafers according to an embodiment.

FIG. 10 illustrates a wafer bonding system with a zoned displacement stage according to an embodiment. FIG. 10 is a cross-sectional side-view 1000 of a wafer bonding system with zoned vertical displacement stages on the bottom chuck or wafer handler 1003, arranged in accordance with at least some implementations of the present disclosure. For example, via any number (e.g., twelve in the illustrated embodiment) of locally variable displacement stages, different regions of the bottom chuck are at different heights. After the chucking force (e.g., vacuum) is applied, the bottom wafer 202 will conform to the non-flat shape of the bottom chuck or wafer handler 1003. The bonding sequence begins when wafer deformer 209 (e.g., an initiation pin) pushes the top wafer into contact with the bottom wafer, and the top chuck releases the top wafer As shown in FIG. 10, the bottom chuck or wafer handler 1003 is divided into any number (e.g., twelve) independent regions, each of which contains a vertical displacement stage. Using the vertical displacement stages, the bottom chuck or wafer handler 1003 can have an adjustable non-flat profile. The zones shown control the topography of the chuck at different wafer radii, but can be further refined to have different topography at different azimuthal sections of the wafer (which will result in many more than 12 zones, similar to those illustrated with respect to the thermal chuck in FIG. 8). When the chuck is engaged, bottom wafer 202 conforms to the shape of the bottom chuck, which may not be flat. The local vertical distortion has an impact on the final in-plane bonding distortion, and can be tuned to compensate the bonding distortion.

In an embodiment, the displacement stages are ring-shape (or annular shape) piezoelectric stack actuators. For example, the displacement stages may be annular shaped and provided concentrically. In an embodiment, the displacement stages are pin shaped or the like and provided in a grid pattern. Any number of such displacement stages arrayed in any manner can provide the zones to create an adjustable bottom chuck shape. In an embodiment, the maximum vertical displacement of the displacement stages is about +/−100 nm. In some embodiments, the maximum vertical displacement is in the range of 100-1000 nm. The chucking system of wafer holder 1003 for securing wafer 202 may be: vacuum (e.g., the air pressure can be achieved through gaps between adjacent piezoelectric actuators), electrostatic (e.g., the top surface of the piezoelectric actuators can have an electrostatic pad), or adhesive (the top surface of the piezoelectric actuator may have an adhesive).

For example, bottom chuck or wafer holder 1003 provides for an on demand or changeable non-flat shape, which may be used in order to tune the bonding distortion observed, which may not be a fixed profile and can depend on wafers, technologies, products, processes, etc.

In the embodiment illustrated in FIG. 10, the bottom chuck (e.g., wafer holder 1003) has displacement stages. In an embodiment, the top chuck (e.g., wafer holder 1005) has local displacement stages. In an embodiment, both the bottom chuck (e.g., wafer holder 1003) and the top chuck (e.g., wafer holder 1005) have displacement stages.

In an embodiment, a system for wafer to wafer bonding includes wafer holder 1005 to hold wafer 204 comprising a surface opposite wafer holder 1005, a wafer holder 1003 to hold wafer 202 comprising a surface opposite wafer holder 1003 such that wafer holder 1003 includes an array of displacement stages to locally deform wafer 202, and wafer deformer 209 to bring a region of the surface opposite wafer holder 1005 into contact with a region of the surface opposite wafer holder 1003. In an embodiment, the array of displacement stages comprises an array of concentric annular displacement stages. In an embodiment, the array of displacement stages comprises an array of concentric arc shaped displacement stages. In an embodiment, the array of displacement stages comprises an array of concentric arc shaped displacement stages such that each concentric arc shaped displacement stage is a part or a portion of an annular collection of arc shaped displacement stages. In an embodiment, the array of displacement stages comprises an array of pin shaped displacement stages in a grid array. The displacement stages may be any suitable moveable elements such as piezoelectric stack actuators.

The described components of the temperature-controlled chuck and shape control chuck may be implemented separately or together. For example, in some embodiments, a wafer holder includes an array of local heating and/or cooling elements to locally heat and/or cool a wafer to induce thermal expansion and/or contraction in the second wafer and an array of displacement stages to locally deform the wafer. In such embodiments, the array of local heating and/or cooling elements and the array of displacement stages may include any characteristics described herein.

As described, in an embodiment, a shape-controlled chuck has a profile that varies azimuthally as well as radially (e.g., providing arc shaped displacement stages in analogy to the arc shaped heating and/or cooling elements illustrated in FIG. 9B). In such embodiments, the shape-controlled chuck may induce the negative of the expected IPD pattern in the bottom wafer, such a shape variously shown by views 1100, 1110 in FIG. 11. The shape illustrated in FIG. 11 has a peak in the center, valleys along the <110> directions, and saddles along the <100> directions, and is described by cosine functions. The contoured chuck shape illustrated with respect to FIG. 11 may be provided by a shape-controlled chuck as described or by a machined chuck having the illustrated shape.

In FIG. 12, a proposed orientation of a bottom wafer 1200 and a top wafer 1210 is presented, for (100) wafers such as (100) silicon wafers. As shown in FIG. 12, in some embodiments, bottom wafer 1200 and top wafer 1210 (e.g., bottom wafer 202 and top wafer 204, respectively) are rotated by 45° with respect to one for bonding. For example, both bottom wafer 1200 and top wafer 1210 may include (100) silicon wafers comprising a <110> plane (e.g., aligned with a notch of the wafers). Such 45° offset or rotation techniques may be used alone or in combination with any techniques such as local heating and/or cooling techniques and/or local wafer deformation techniques described herein. In various embodiments, different notch orientations may be used—e.g., wherein a notch is not aligned to a <100> plane—so that, in one or more regards, notch rotation and crystal plane rotation are independent.

FIG. 13A shows a plot 1300 illustrating an example of IPD residuals of a (100) wafer bonding process without a 45° offset (e.g., with notches aligned). FIG. 13B shows a plot 1310 illustrating an example change in the residuals when the top wafer is rotated by 45° (e.g., a 45° offset is provided). The IPD residuals are greater than tens of nanometers and the average is 30% lower for the 45° offset case as compared to the no offset case. In the case of bonding without a 45° offset, azimuthal components of the IPD residuals are visible and nonlinear across the wafer. Such IPD components are advantageously suppressed in the 45° rotation case.

Figure 14A:
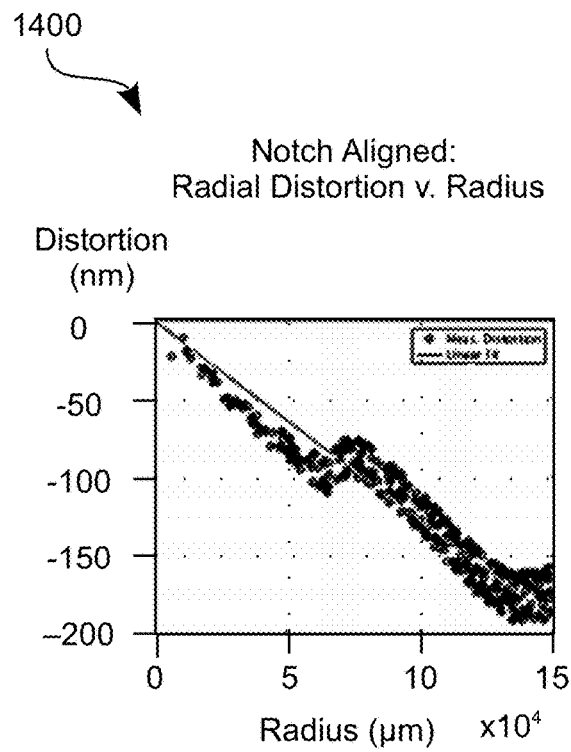
FIGS. 14A, 14B show graphs illustrating in-plane distortion features each for a respective wafer bond process according to a corresponding embodiment.
Figure 14B:
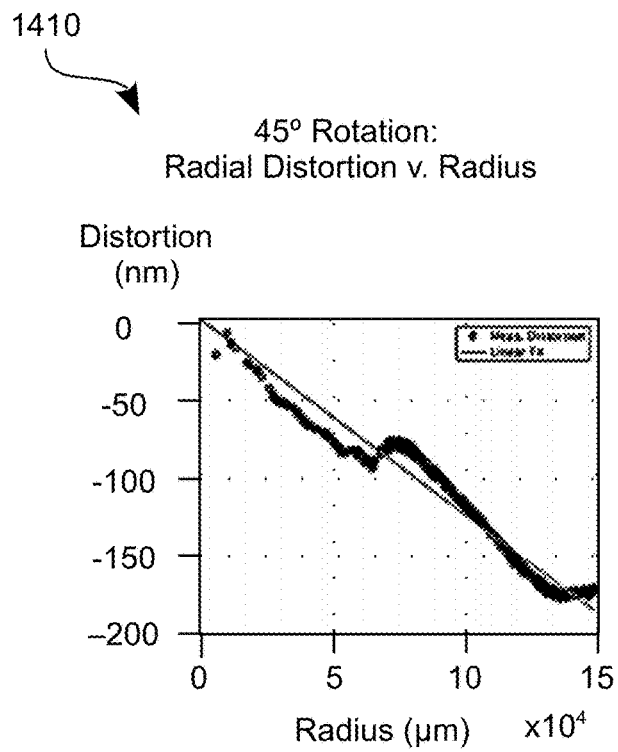

FIGS. 14A, 14B illustrate example plots 1400, 1410 of in-plane distortion vs. radius. As shown, in FIG. 14A, there is large variation in the case of bonding without a 45° offset and the distortion is not linear vs. radius. As shown, in FIG. 14B, in the 45° offset case, the variation is significantly reduced, although the distortion is still not linear vs. radius.

As described, such 45° rotation offset techniques may be combined with the described local heating and/or cooling techniques and/or local wafer deformation techniques. For example, with only radial components of IPD residual remaining after the implementation of the described 45° rotation offset, simpler chuck zoning techniques (e.g., via local heating and/or cooling techniques and/or local wafer deformation) may be sufficient to correct the remaining residuals.

As described, one goal of the zoned thermal chuck described herein may be to linearize a distortion profile such as the distortion profile illustrated in FIG. 14B, which reduces IPD residuals after first ordered correction. For example, the top wafer may be rotated 45° to suppress azimuthal components allowing for a radial control-only via thermal zones.

Figure 15:
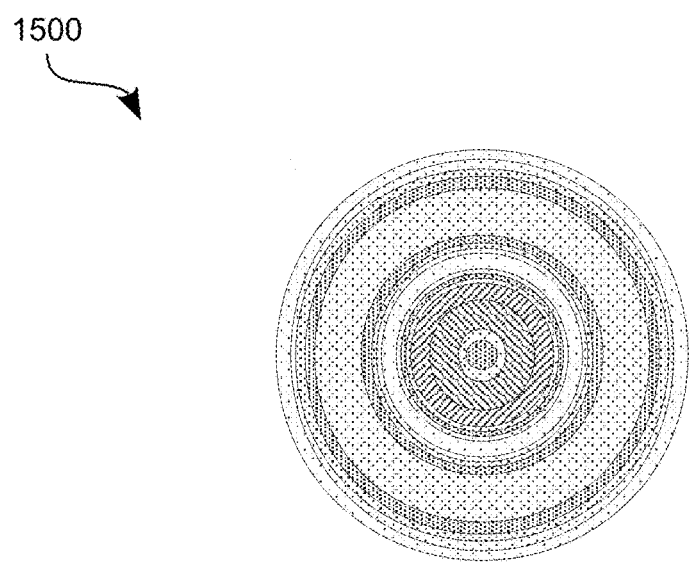
FIG. 15 illustrates a top view of a wafer which is provided with a thermal profile during a wafer bond process according to an embodiment.

In an embodiment, a thermal profile for the bottom wafer may be provided as shown by a top view 1500 in FIG. 15. As described, the provided temperature gradient locally expands or contracts the bottom wafer and may be provided in such a manner as to compensate for the bonding distortions illustrated in FIG. 13B. As shown, the variation in wafer temperature may be in the range of about 2.5° C., which may be achieved with heaters and coolers of up to 20.5 W in power.

Figure 16A:
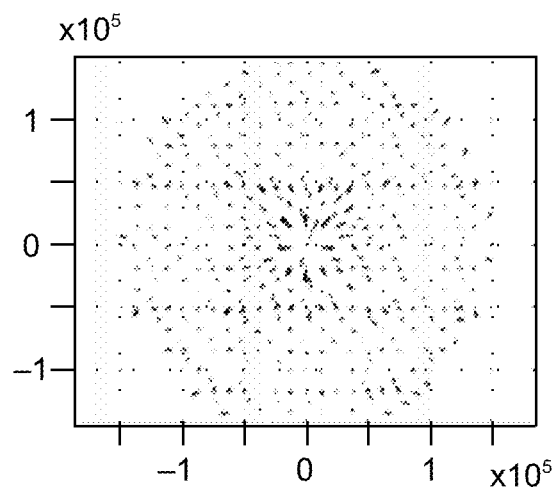
FIGS. 16A, 16B shows plots illustrating in-plane distortion characteristics of a wafer bond process according to an embodiment.
Figure 16B:
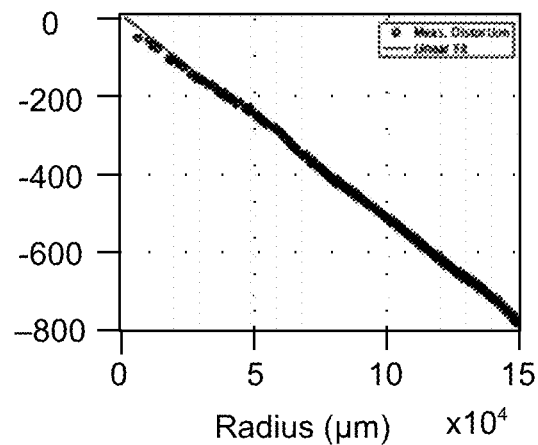

FIG. 16A illustrates an example residual map 1600 after bonding using the described wafer rotation and local heating/cooling techniques, which has 60% lower residuals than those in FIG. 13B. FIG. 16B illustrates an example graph 1610 of radial distortion, which has been linearized using the temperature profile provided by the local heating/cooling techniques. Such advantageously reduced IPD residuals make it possible for subsequent patterning steps to proceed. For example, FIGS. 16A, 16B provide example results of the thermal zoned chuck techniques combined with 45° wafer rotation techniques such that FIG. 16A illustrates example IPD residuals and 16B illustrates example distortion vs. radius.

Similar to the zoned temperature-controlled chuck, a goal of the zoned shape-controlled chuck may be to linearize a distortion profile such as the distortion profile illustrated in FIG. 13B, which reduces IPD residuals after first ordered correction. For example, the top wafer may be rotated 45° to suppress azimuthal components allowing for a radial control-only via shape control zones.

Figure 17:
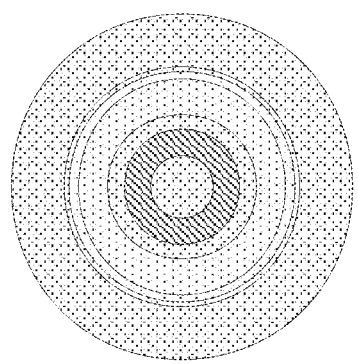
FIG. 17 illustrates a top view of a wafer which is provided with a height profile during a wafer bond process according to an embodiment.
Figure 17:
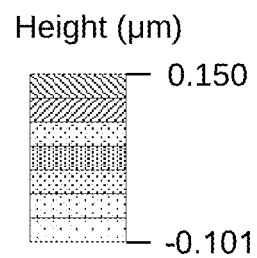

In an embodiment, a chuck profile for the bottom wafer may be provided as shown by the top view 1700 in FIG. 17. As described, the chuck profile locally deforms the bottom wafer in accordance with the chuck profile and the chuck profile may be provided in such a manner as to compensate for the bonding distortions illustrated in FIG. 13B.

FIG. 17 illustrates an example height profile provided by a shape-controlled chuck (e.g., a chuck profile), arranged in accordance with at least some implementations of the present disclosure. In the illustrated embodiment, the displacement stages (e.g., piezoelectric actuators) raise or lower different radial regions of the wafer over a −101 to +150 nm height variation.

Figure 18A:
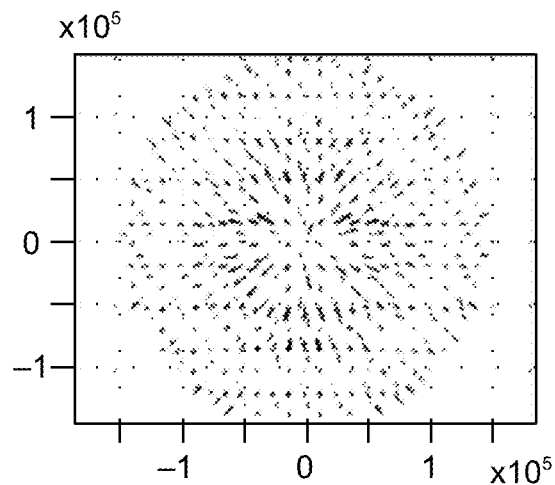
FIGS. 18A, 18B illustrate plots of in-plane distortion characteristics of a wafer bond process according to an embodiment.
Figure 18B:
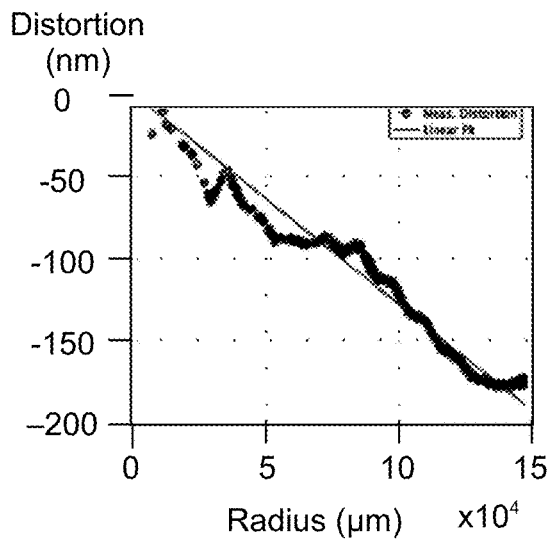

FIG. 18 shows plots 1800, 1810 illustrating example residual results of bonding distortion. Compared to the reference results illustrated in FIGS. 13A and 13B, the zoned shape chuck reduces average residuals by 15%. Greater fine-tuning of the chuck profile will further reduce the residuals. For example, FIG. 18 provides example results of the zone shaped chuck techniques combined with 45° wafer rotation techniques such that FIG. 18A illustrates example IPD residuals and FIG. 18B illustrates example distortion vs. radius.

Figure 11:
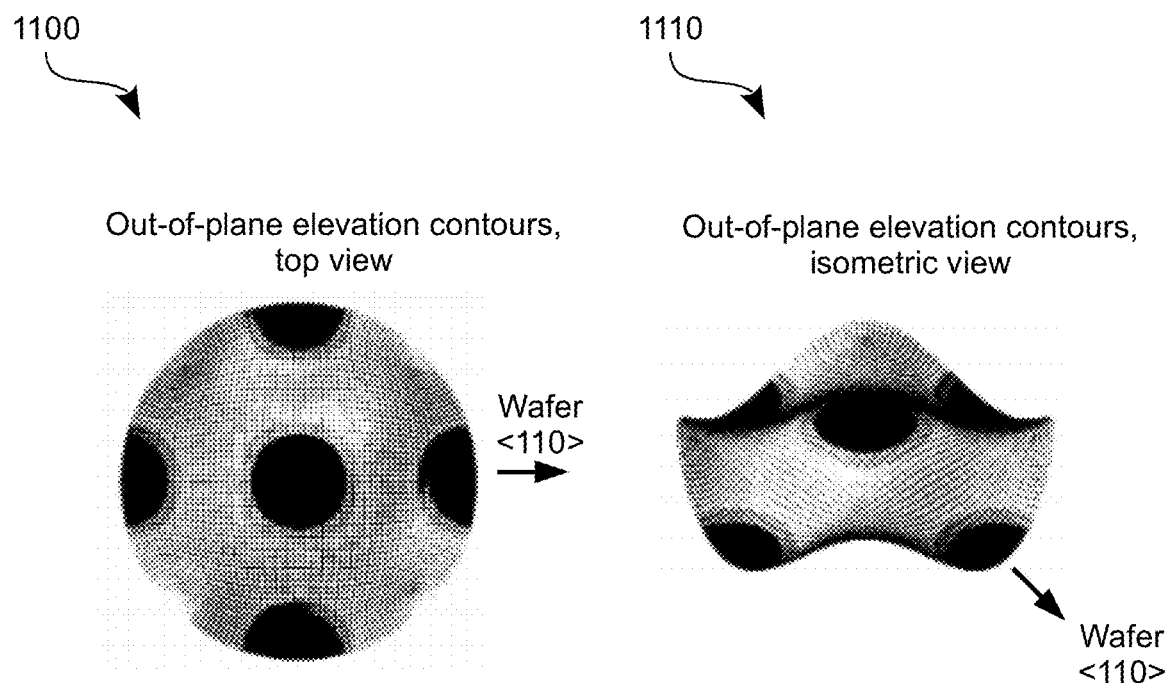
FIG. 11 show respective views each of an in-plane distortion during a wafer bond process according to an embodiment.
Figure 19:
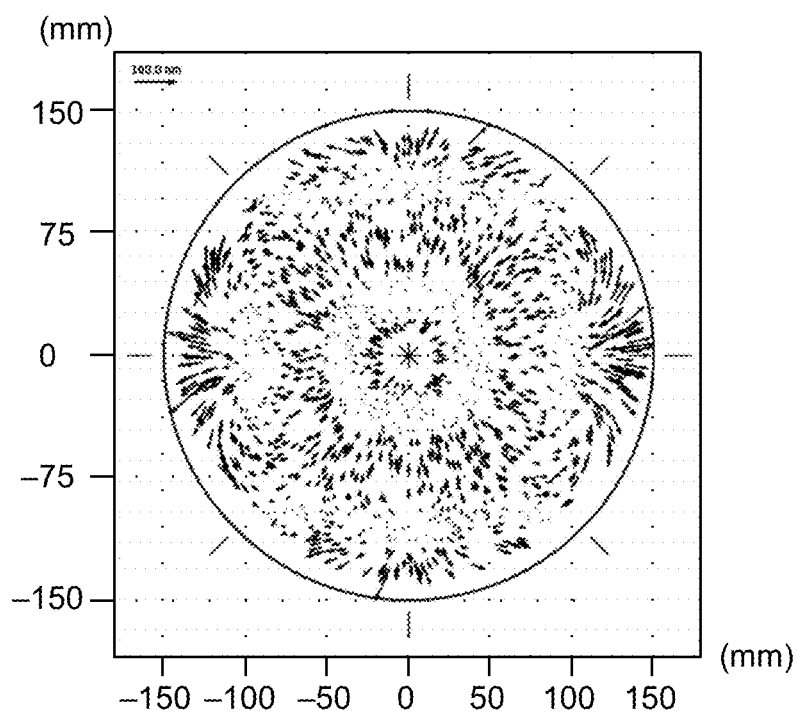
FIG. 19 illustrate a graph of in-plane distortion characteristics of a wafer bond process according to an embodiment.

Furthermore, the contoured chuck illustrated herein with respect to FIG. 11 (e.g., as provided by a chuck comprising arc shaped displacement stages or a machined chuck) reduces the IPD residuals by about 50%, from 45 nm average to 20 nm average as shown by graph 1900 in FIG. 19. Several regions show near-zero residual, such as the ring around the center, and at the locations of the <100> valleys. Further tuning of the shape will reduce the residuals even further.

Figure 20:
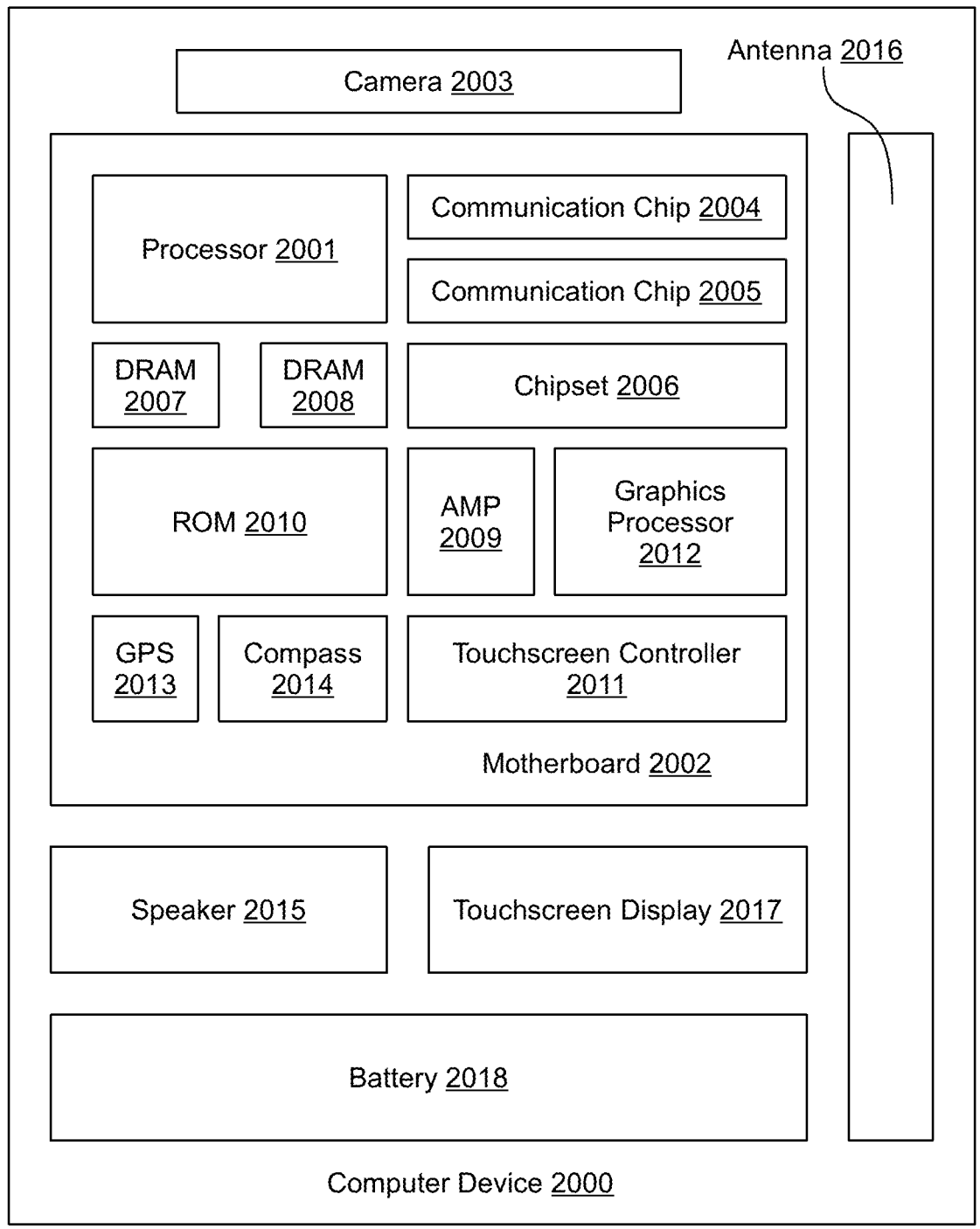
FIG. 20 illustrate a functional block diagram showing a computing device in accordance with one embodiment.

FIG. 20 is a functional block diagram of a computing device 2000, arranged in accordance with at least some implementations of the present disclosure. As described, computing device 2000 or portions thereof may be implemented as controller to control wafer holders, wafer deformers, rollers, an array of local heating and/or cooling elements, an array of displacement stages, or the like. In some embodiments, computing device 2000 or portions thereof may be implemented via a mobile computing platform. As shown, computing device 2000 includes a motherboard 2002 hosting a number of components, such as, but not limited to, a processor 2001 (e.g., an applications processor, a microprocessor, etc.) and one or more communications chips 2004, 2005. Processor 2001 may be physically and/or electrically coupled to motherboard 2002. In some examples, processor 2001 includes an integrated circuit die packaged within the processor 2001. In general, the term "processor" may refer to any device or portion of a device that processes electronic data from registers and/or memory to transform that electronic data into other electronic data that may be stored in registers and/or memory.

In various examples, one or more communication chips 2004, 2005 may also be physically and/or electrically coupled to the motherboard 2002. In further implementations, communication chips 2004 may be part of processor 2001. Depending on its applications, computing device 2000 may include other components that may or may not be physically and electrically coupled to motherboard 2002. These other components may include, but are not limited to, volatile memory (e.g., DRAM) 2007, 2008, non-volatile memory (e.g., ROM) 2010, a graphics processor 2012, flash memory, global positioning system (GPS) device 2013, compass 2014, a chipset 2006, an antenna 2016, a power amplifier 2009, a touchscreen controller 2011, a touchscreen display 2017, a speaker 2015, a camera 2003, and a battery 2018, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 2017 may implement any emissive display device structure(s) described herein.

Communication chips 2004, 2005 may enable wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2004, 2005 may implement any of a number of wireless standards or protocols, including but not limited to those described elsewhere herein. As described, computing device 2000 may include a plurality of communication chips 2004, 2005. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, 5G, and others. For example, one or both of communication chips 2004, 2005 may provide a wireless transceiver for computing device 2000. As described, touchscreen display 2017 of computing device 2000 may include or utilize one or more emissive display device structures described herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Figure 21:
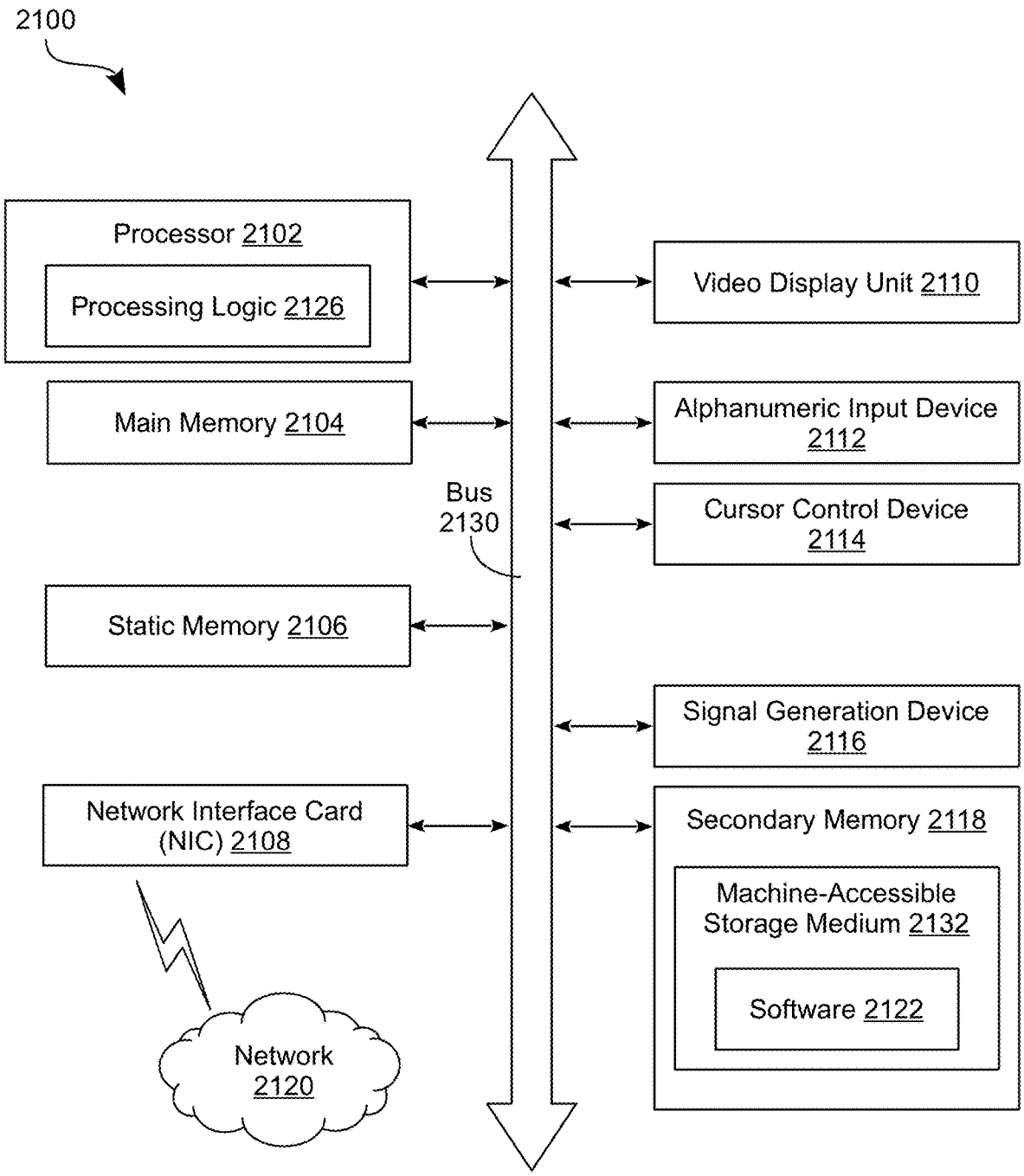
FIG. 21 illustrate a functional block diagram showing an exemplary computer system, in accordance with one embodiment.

FIG. 21 illustrates a diagrammatic representation of a machine in the exemplary form of a computer system 2100 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 2100 includes a processor 2102, a main memory 2104 (e.g., read-only memory (ROM), flash memory, dynamic random access memory (DRAM) such as synchronous DRAM (SDRAM) or Rambus DRAM (RDRAM), etc.), a static memory 2106 (e.g., flash memory, static random access memory (SRAM), etc.), and a secondary memory 2118 (e.g., a data storage device), which communicate with each other via a bus 2130.

Processor 2102 represents one or more general-purpose processing devices such as a microprocessor, central processing unit, or the like. More particularly, the processor 2102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 2102 may also be one or more special-purpose processing devices such as an application specific integrated circuit (ASIC), a field programmable gate array (FPGA), a digital signal processor (DSP), network processor, or the like. Processor 2102 is configured to execute the processing logic 2126 for performing the operations described herein.

The computer system 2100 may further include a network interface device 2108. The computer system 2100 also may include a video display unit 2110 (e.g., a liquid crystal display (LCD), a light emitting diode display (LED), or a cathode ray tube (CRT)), an alphanumeric input device 2112 (e.g., a keyboard), a cursor control device 2114 (e.g., a mouse), and a signal generation device 2116 (e.g., a speaker).

The secondary memory 2118 may include a machine-accessible storage medium (or more specifically a computer-readable storage medium) 2132 on which is stored one or more sets of instructions (e.g., software 2122) embodying any one or more of the methodologies or functions described herein. The software 2122 may also reside, completely or at least partially, within the main memory 2104 and/or within the processor 2102 during execution thereof by the computer system 2100, the main memory 2104 and the processor 2102 also constituting machine-readable storage media. The software 2122 may further be transmitted or received over a network 2120 via the network interface device 2108.

While the machine-accessible storage medium 2132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for bonding wafers are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention.

The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the description herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

The following examples pertain to further embodiments.

In one or more first embodiments, a method for bonding wafers comprises deforming a first wafer comprising a first surface and a second wafer comprising a second surface to provide a first deformed region of the first wafer and a second deformed region of the second wafer, such that the first deformed region and the second deformed region are symmetrical with respect to a centerline between the first deformed region and the second deformed region, contacting a first portion of the first surface comprising the first deformation with a second portion of the second surface comprising the second deformation to form a bond therebetween, and propagating the bond to bond the first surface of the first wafer to the second surface of the second wafer.

In one or more second embodiments, for any of the first embodiments, deforming the first wafer comprises pushing a first pin into a back surface of the first wafer and deforming the second wafer comprises pushing a second pin into a back surface of the second wafer.

In one or more third embodiments, for any of the first or second embodiments, the first deformation is at a location substantially at a center of the first wafer and the second deformation is at a location substantially at a center of the second wafer.

In one or more fourth embodiments, for any of the first through third embodiments, the first deformation is orthogonal to the first surface of the first wafer at a location within 3 mm of a center of the first wafer and the second deformation is orthogonal to the second surface of the second wafer at a location within 3 mm of a center of the second wafer.

In one or more fifth embodiments, for any of the first through fourth embodiments, the first deformation is at a location within an edge region of the first wafer and the second deformation is within an edge region of the second wafer.

In one or more sixth embodiments, for any of the first through fifth embodiments, the first deformation is at a location within 10 mm of an edge region of the first wafer and the second deformation is within 10 mm of an edge region of the second wafer.

In one or more seventh embodiments, for any of the first through sixth embodiments, deforming the first wafer comprises attaching the first wafer to a first wafer holder comprising a first dome shape and deforming the second wafer comprises attaching the second wafer to a second wafer holder comprising a second dome shape.

In one or more eighth embodiments, for any of the first through seventh embodiments, deforming the first wafer and deforming the second wafer comprises feeding the first wafer and the second wafer between a first roller and a second roller, such that contacting the first wafer with the first roller deforms the first wafer and contacting the second wafer with the second roller deforms the second wafer.

In one or more ninth embodiments, for any of the first through eighth embodiments, the first surface of the first wafer and the second surface of the second wafer are substantially vertical such that the first surface of the first wafer and the second surface of the second wafer are substantially aligned with local gravity.

In one or more tenth embodiments, a system comprises a first wafer holder to hold a first wafer and comprising a first wafer deformer and a second wafer holder to hold a second wafer and comprising a second wafer deformer, such that the first wafer deformer is to deform the first wafer comprising a first surface and the second wafer deformer is to deform the second wafer comprising a second surface to provide a first deformed region of the first wafer and a second deformed region of the second wafer, such that the first deformed region and the second deformed region are symmetrical with respect to a centerline between the first deformed region and the second deformed region, and such that the first wafer holder and the second wafer are to bring a first portion of the first surface comprising the first deformation into contact with a second portion of the second surface comprising the second deformation.

In one or more eleventh embodiments, for any of the tenth embodiments, the first wafer deformer comprises a first pin to provide a deformation orthogonal to the first surface of the first wafer and the second wafer deformer comprises a second pin to provide a deformation orthogonal to the second surface of the second wafer.

In one or more twelfth embodiments, for any of the tenth or eleventh embodiments, the first wafer deformer comprises a first pin to provide a deformation orthogonal to the first surface of the first wafer at a location substantially at a center of the first wafer and the second wafer deformer comprises a second pin to provide a deformation orthogonal to the second surface of the second wafer at a location substantially at a center of the second wafer.

In one or more thirteenth embodiments, for any of the tenth through twelfth embodiments, the first wafer deformer comprises a first pin to provide a deformation orthogonal to the first surface of the first wafer at a location within 3 mm of a center of the first wafer and the second wafer deformer comprises a second pin to provide a deformation orthogonal to the second surface of the second wafer at a location within 3 mm of a center of the second wafer.

In one or more fourteenth embodiments, for any of the tenth through thirteenth embodiments, the first wafer deformer comprises a first pin to provide a deformation orthogonal to the first surface of the first wafer at a location within an edge region of the first wafer and the second wafer deformer comprises a second pin to provide a deformation orthogonal to the second surface of the second wafer within an edge region of the second wafer.

In one or more fifteenth embodiments, for any of the tenth through fourteenth embodiments, the first wafer deformer comprises a first pin to provide a deformation orthogonal to the first surface of the first wafer at a location within 10 mm of an edge of the first wafer and the second wafer deformer comprises a second pin to provide a deformation orthogonal to the second surface of the second wafer within 10 mm of an edge of the second wafer.

In one or more sixteenth embodiments, for any of the tenth through fifteenth embodiments, the first wafer deformer comprises a first deformation portion of the first wafer holder and the second wafer deformer comprises a second deformation portion of the second wafer holder, the first and second deformation portions comprising dome shaped deformation portions.

In one or more seventeenth embodiments, for any of the tenth through sixteenth embodiments, the first wafer deformer comprises a first roller to provide a deformation orthogonal to the first surface of the first wafer and the second wafer deformer comprises a second roller to provide a deformation orthogonal to the second surface of the second wafer.

In one or more eighteenth embodiments, for any of the tenth through seventeenth embodiments, the first wafer deformer comprises a first roller to provide a deformation orthogonal to the first surface of the first wafer at a location within an edge region of the first wafer and the second wafer deformer comprises a second roller to provide a deformation orthogonal to the second surface of the second wafer at a location within an edge region of the second wafer.

In one or more nineteenth embodiments, for any of the tenth through eighteenth embodiments, the first wafer holder is to hold the first wafer and the second wafer holder is to hold the second wafer such that the first surface of the first wafer and the second surface of the second wafer are substantially vertical such that the first surface of the first wafer and the second surface of the second wafer are substantially aligned with local gravity.

In one or more twentieth embodiments, a method for bonding wafers comprises bringing a first surface of a first wafer within close proximity of a second surface of a second wafer, wherein the second wafer is secured to a wafer holder comprising at least one of an array of local heating and/or cooling elements to locally heat and/or cool the second wafer to induce thermal expansion and/or contraction in the second wafer or an array of displacement stages to locally deform the second wafer, contacting a first region of the first surface to a second region of the second surface to form a bond therebetween, and propagating the bond to bond the first surface to the second surface.

In one or more twenty-first embodiments, for any of the twentieth embodiments, the array of local heating and/or cooling elements comprise an array of concentric annular heating and/or cooling elements.

In one or more twenty-second embodiments, for any of the twentieth or twenty-first embodiments, the array of local heating and/or cooling elements comprises an array of concentric arc shaped heating and/or cooling elements.

In one or more twenty-third embodiments, for any of the twentieth through twenty-second embodiments, the array of local heating and/or cooling elements comprises an array of concentric arc shaped heating and/or cooling elements, wherein each concentric arc shaped heating and/or cooling element comprises a portion of an annular collection of arc shaped heating and/or cooling elements.

In one or more twenty-fourth embodiments, for any of the twentieth through twenty-second embodiments, the array of local heating and/or cooling elements comprises one or more of a resistive heating element, a thermoelectric heater, a thermoelectric cooler, or a channel to flow a temperature-controlled liquid or gas.

In one or more twenty-fifth embodiments, for any of the twentieth through twenty-fourth embodiments, the array of displacement stages comprises an array of concentric annular displacement stages.

In one or more twenty-sixth embodiments, for any of the twentieth through twenty-fifth embodiments, the array of displacement stages comprises an array of concentric arc shaped displacement stages.

In one or more twenty-seventh embodiments, for any of the twentieth through twenty-sixth embodiments, the array of displacement stages comprises an array of concentric arc shaped displacement stages, wherein each concentric arc shaped displacement stage comprises a portion of an annular collection of arc shaped displacement stages.

In one or more twenty-eighth embodiments, for any of the twentieth through twenty-seventh embodiments, array of displacement stages comprises one or more of a piezoelectric stack actuator.

In one or more twenty-ninth embodiments, for any of the twentieth through twenty-eighth embodiments, the first wafer holder comprises a wafer deformer to deform the first wafer to bring the first region of the first surface into contact with the second region of the second surface.

In one or more thirtieth embodiments, for any of the twentieth through twenty-ninth embodiments, the first wafer and the second wafer both comprise (100) silicon and the method further comprises aligning the first wafer holder with a substantially 45° offset with respect to the second wafer.

In one or more thirty-first embodiments, a system comprises a first wafer holder to hold a first wafer comprising a first surface, a second wafer holder to hold a second wafer comprising a second surface, the second wafer holder comprising at least one of an array of local heating and/or cooling elements to locally heat and/or cool the second wafer to induce thermal expansion and/or contraction in the second wafer or an array of displacement stages to locally deform the second wafer, and a wafer deformer to bring a first region of the first surface into contact with a second region of the second surface.

In one or more thirty-second embodiments, for any of the thirty-first embodiments, the array of local heating and/or cooling elements comprise an array of concentric annular heating and/or cooling elements.

In one or more thirty-third embodiments, for any of the thirty-first or thirty-second embodiments, the array of local heating and/or cooling elements comprises an array of concentric arc shaped heating and/or cooling elements.

In one or more thirty-fourth embodiments, for any of the thirty-first through thirty-third embodiments, the array of local heating and/or cooling elements comprises an array of concentric arc shaped heating and/or cooling elements, wherein each concentric arc shaped heating and/or cooling element comprises a portion of an annular collection of arc shaped heating and/or cooling elements.

In one or more thirty-fifth embodiments, for any of the thirty-first through thirty-fourth embodiments, the array of local heating and/or cooling elements comprises one or more of a resistive heating element, a thermoelectric heater, a thermoelectric cooler, or a channel to flow a temperature-controlled liquid or gas.

In one or more thirty-sixth embodiments, for any of the thirty-first through thirty-fifth embodiments, the array of displacement stages comprises an array of concentric annular displacement stages.

In one or more thirty-seventh embodiments, for any of the thirty-first through thirty-sixth embodiments, the array of displacement stages comprises an array of concentric arc shaped displacement stages.

In one or more thirty-eighth embodiments, for any of the thirty-first through thirty-seventh embodiments, the array of displacement stages comprises an array of concentric arc shaped displacement stages, wherein each concentric arc shaped displacement stage comprises a portion of an annular collection of arc shaped displacement stages.

In one or more thirty-ninth embodiments, for any of the thirty-first through thirty-eighth embodiments, the array of displacement stages comprises one or more of a piezoelectric stack actuator.

In one or more fortieth embodiments, for any of the thirty-first through thirty-ninth embodiments, the first wafer and the second wafer both comprise (100) silicon and wherein the first wafer holder is to hold the first wafer with a substantially 45° offset with respect to the second wafer.

In one or more forty-first embodiments, for any of the thirty-first through fortieth embodiments, the first wafer and the second wafer both comprise (100) silicon and wherein the first wafer holder is to hold the first wafer with a substantially 45° offset with respect to the second wafer.

What is claimed is:

1. A system for bonding wafers, the system comprising:
   a first wafer holder to hold a first wafer comprising a first surface;
   a first wafer deformer to deform the first surface to provide a first deformation of the first wafer;
   a second wafer holder to hold a second wafer comprising a second surface; and
   a second wafer deformer to deform the second surface to provide a second deformation of the second wafer;
   wherein one or more of the first wafer holder, the second wafer holder, the first wafer deformer, or the second wafer deformer are to bring the first surface and the second surface into an initial contact with each other at a first portion of the first deformation and a second portion of the second deformation while the first wafer holder and the second wafer holder are to maintain respective other portions of the first wafer and the second wafer away from a centerline between the first surface and the second surface,
   wherein the first deformation and the second deformation are to be symmetrical to each other about the centerline, and
   wherein a bond between the first surface and the second surface is to propagate from the initial contact in parallel with the centerline.

2. The system of claim 1, wherein:
   the first wafer deformer comprises a first pin to provide the first deformation orthogonal to the first surface of the first wafer, and the second wafer deformer comprises a second pin to provide the second deformation orthogonal to the second surface of the second wafer; or
   the first wafer deformer comprises a first roller to provide the first deformation orthogonal to the first surface of the first wafer, and the second wafer deformer comprises a second roller to provide the second deformation orthogonal to the second surface of the second wafer.

3. The system of claim 1, wherein the first wafer deformer comprises a first pin to provide the first deformation orthogonal to the first surface of the first wafer at a location substantially at a center of the first wafer, and wherein the second wafer deformer comprises a second pin to provide the second deformation orthogonal to the second surface of the second wafer at a location substantially at a center of the second wafer.

4. The system of claim 1, wherein the first wafer deformer comprises a first pin to provide the first deformation orthogonal to the first surface of the first wafer at a location within 3 millimeters (mm) of a center of the first wafer, and wherein the second wafer deformer comprises a second pin to provide the second deformation orthogonal to the second surface of the second wafer at a location within 3 mm of a center of the second wafer.

5. The system of claim 1, wherein the first wafer deformer comprises a first pin to provide the first deformation orthogonal to the first surface of the first wafer at a location within an edge region of the first wafer, and wherein the second wafer deformer comprises a second pin to provide the second deformation orthogonal to the second surface of the second wafer within an edge region of the second wafer.

6. The system of claim 1, wherein the first wafer deformer comprises a first pin to provide the first deformation orthogonal to the first surface of the first wafer at a location within 10 millimeters (mm) of an edge of the first wafer, and wherein the second wafer deformer comprises a second pin to provide the second deformation orthogonal to the second surface of the second wafer within 10 mm of an edge of the second wafer.

7. The system of claim 1, wherein the first wafer deformer comprises a first deformation portion of the first wafer holder, and wherein the second wafer deformer comprises a second deformation portion of the second wafer holder, the first and second deformation portions comprising dome shaped deformation portions.

8. The system of claim 1, wherein the first wafer deformer comprises a first roller to provide the first deformation orthogonal to the first surface of the first wafer, and wherein the second wafer deformer comprises a second roller to provide the second deformation orthogonal to the second surface of the second wafer.

9. The system of claim 1, wherein the first wafer deformer comprises a first roller to provide the first deformation orthogonal to the first surface of the first wafer at a location within an edge region of the first wafer, and wherein the second wafer deformer comprises a second roller to provide the second deformation orthogonal to the second surface of the second wafer at a location within an edge region of the second wafer.

10. The system of claim 1, wherein the first wafer holder is to hold the first wafer and the second wafer holder is to hold the second wafer, wherein the first surface of the first wafer and the second surface of the second wafer are substantially vertical, wherein the first surface of the first wafer and the second surface of the second wafer are substantially aligned with local gravity.

11. The system of claim 1, wherein the second wafer holder comprises at least one of an array of local elements to locally heat or cool the second wafer to induce thermal expansion or contraction in the second wafer or an array of displacement stages to locally deform the second wafer.

12. The system of claim 11, wherein the array of local elements comprises an array of concentric annular elements or an array of arc shaped elements.

13. The system of claim 11, wherein the array of displacement stages comprises an array of concentric annular displacement stages or an array of arc shaped displacement stages.

* * * * *